US011309893B2

(12) United States Patent
Akahane

(10) Patent No.: US 11,309,893 B2
(45) Date of Patent: Apr. 19, 2022

(54) DRIVE CIRCUIT

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/185,735

(22) Filed: Feb. 25, 2021

(65) Prior Publication Data
US 2021/0184679 A1    Jun. 17, 2021

Related U.S. Application Data

(63) Continuation of application No. PCT/JP2020/007309, filed on Feb. 25, 2020.

(30) Foreign Application Priority Data

Mar. 29, 2019 (JP) .............................. JP2019-066332

(51) Int. Cl.
*H03K 3/00* (2006.01)
*H03K 17/06* (2006.01)
*H03K 17/16* (2006.01)
(Continued)

(52) U.S. Cl.
CPC ..... *H03K 19/018521* (2013.01); *H03K 19/20* (2013.01)

(58) Field of Classification Search
None
See application file for complete search history.

(56) References Cited

U.S. PATENT DOCUMENTS 6,326,831 B1 * 12/2001 Kumagai ............... H03K 17/14
326/80
6,734,706 B2 * 5/2004 Yoshida ............... H03K 17/162
327/108
(Continued)

FOREIGN PATENT DOCUMENTS

JP          3429937 B2    7/2003
JP      2008-278729 A    11/2008
(Continued)

OTHER PUBLICATIONS

International Search Report for PCT/JP2020/007309, dated May 26, 2020.

*Primary Examiner* — Kenneth B Wells
(74) *Attorney, Agent, or Firm* — Rabin & Berdo, P.C.

(57) ABSTRACT

A drive circuit having a set-side level shift circuit and a reset-side level shift circuit each configured to shift a level of a set or reset signal, and output the level-shifted set or reset signal from a set-side or reset-side output node, a mask-signal generating circuit configured to output a mask signal in response to a change in a voltage at the set-side or reset-side output node, and a control circuit configured to output a drive signal to a power device. The mask signal is for a time period shorter than a time period during which the level-shifted set or reset signal is outputted. The drive signal remains at a same level while the control circuit is receiving the mask signal, and switches to a first level or a second level, for turning off or on the power device, in response to the control circuit receiving the level-shifted reset or set signal after receiving the mask signal.

19 Claims, 14 Drawing Sheets

(51) Int. Cl.
    *H03K 17/687*     (2006.01)
    *H03K 19/0185*    (2006.01)
    *H03K 19/20*      (2006.01)

(56) References Cited

U.S. PATENT DOCUMENTS

| | | | | |
|---|---|---|---|---|
| 7,521,982 | B2* | 4/2009 | Shimizu | H03K 3/0375 |
| | | | | 326/27 |
| 7,595,667 | B2* | 9/2009 | Liang | H03K 5/1252 |
| | | | | 327/108 |
| 8,558,585 | B2* | 10/2013 | Ishimatsu | H03K 19/018521 |
| | | | | 327/108 |
| 8,779,806 | B2* | 7/2014 | Tseng | H03L 5/00 |
| | | | | 327/108 |
| 9,444,249 | B2* | 9/2016 | Imanishi | H02H 7/1227 |
| 9,722,601 | B2* | 8/2017 | Niikura | H02M 7/5387 |
| 2008/0278215 | A1 | 11/2008 | Sakai et al. | |
| 2016/0036315 | A1 | 2/2016 | Ohashi et al. | |
| 2016/0065205 | A1 | 3/2016 | Niikura et al. | |
| 2019/0028097 | A1 | 1/2019 | Song et al. | |

FOREIGN PATENT DOCUMENTS

| | | |
|---|---|---|
| JP | 2011-139423 A | 7/2011 |
| JP | 2013-179501 A | 9/2013 |
| JP | 2015-062298 A | 4/2015 |
| JP | 2016-046775 A | 4/2016 |
| WO | 2012/043750 A1 | 4/2012 |
| WO | 2015/045534 A1 | 4/2015 |

* cited by examiner

DRIVE CIRCUIT

CROSS-REFERENCE TO RELATED APPLICATIONS

This is a continuation application of International Patent Application No. PCT/JP2020/007309 filed Feb. 25, 2020, which claims the benefit of priority to Japanese Patent Application No. 2019-066332 filed Mar. 29, 2019, the entire contents of each of which the entire contents of each of which are incorporated herein by reference.

BACKGROUND

Technical Field

The present disclosure relates to a drive circuit that drives a power device.

Description of the Related Art

As disclosed in Japanese Patent Application Publication Nos. 2013-179501 and 2011-139423, a half bridge circuit includes first and second power switching devices coupled in series between a high potential terminal and a low potential terminal of a power supply, and a node between the first power switching device and the second power switching device is coupled to a load such as a motor. The load is driven by turning on and off the first power switching device and turning on and off the second power switching device complementarily to the first power switching device. The second power switching device is turned on and off by being driven by a low-side control circuit that operates using the potential of the low potential terminal of the power supply as the reference potential. The first power switching device is turned on and off by being driven by a high-side control circuit that operates using the potential of the node between the first power switching device and the second power switching device as the reference potential.

The high-side control circuit is coupled to a level shift circuit disposed in its preceding stage. The level shift circuit, for example, inverts and shifts the direct-current (DC) levels of a set signal and a reset signal, and outputs the level-shifted set signal from a set-side output node, and outputs the level-shifted reset signal from a reset-side output node. The high-side control circuit includes a control circuit that turns on and off the first power switching device in response to signals based on the levels of the level-shifted set signal and the level-shifted reset signal outputted by the level shift circuit.

Incidentally, due to external noise caused by a three-phase current and/or the like, one of the voltages at the set-side output node and the reset-side output node of the level shift circuit may change with a delay from the other. In such a case, the control circuit malfunctions and cannot turn on and off the first power switching device normally.

The present disclosure has been achieved in light of issues as described above, and is directed to enabling a drive circuit to operate normally even when noise occurs.

SUMMARY OF THE INVENTION

A primary aspect of the present disclosure is a drive circuit comprising: a set-side level shift circuit configured to shift a level of a set signal, and output the level-shifted set signal from a set-side output node; a reset-side level shift circuit configured to shift a level of a reset signal, and output the level-shifted reset signal from a reset-side output node; a mask-signal generating circuit configured to output a mask signal in response to a change in a voltage at the set-side output node or a change in a voltage at the reset-side output node, the mask signal being for a time period shorter than a first time period during which the level-shifted set signal is outputted or shorter than a second time period during which the level-shifted reset signal is outputted; and a control circuit configured to output a drive signal to a power device, the drive signal remaining at a same level while the control circuit is receiving the mask signal, switching to a first level for turning off the power device, in response to the control circuit receiving the level-shifted reset signal after receiving the mask signal, and switching to a second level for turning on the power device, in response to the control circuit receiving the level-shifted set signal after receiving the mask signal.

DETAILED DESCRIPTION

At least following matters will become clear from the descriptions of the present specification and the accompanying drawings.

First Embodiment

An embodiment of the present disclosure will be described below with reference to the drawings. Note that various limitations which are technically preferable for implementing the present disclosure are imposed on an embodiment described below. However, the present disclosure is not limited to embodiments and illustrated examples given below.

1. Outline of Drive Circuit and Output Circuit

Figure 1:
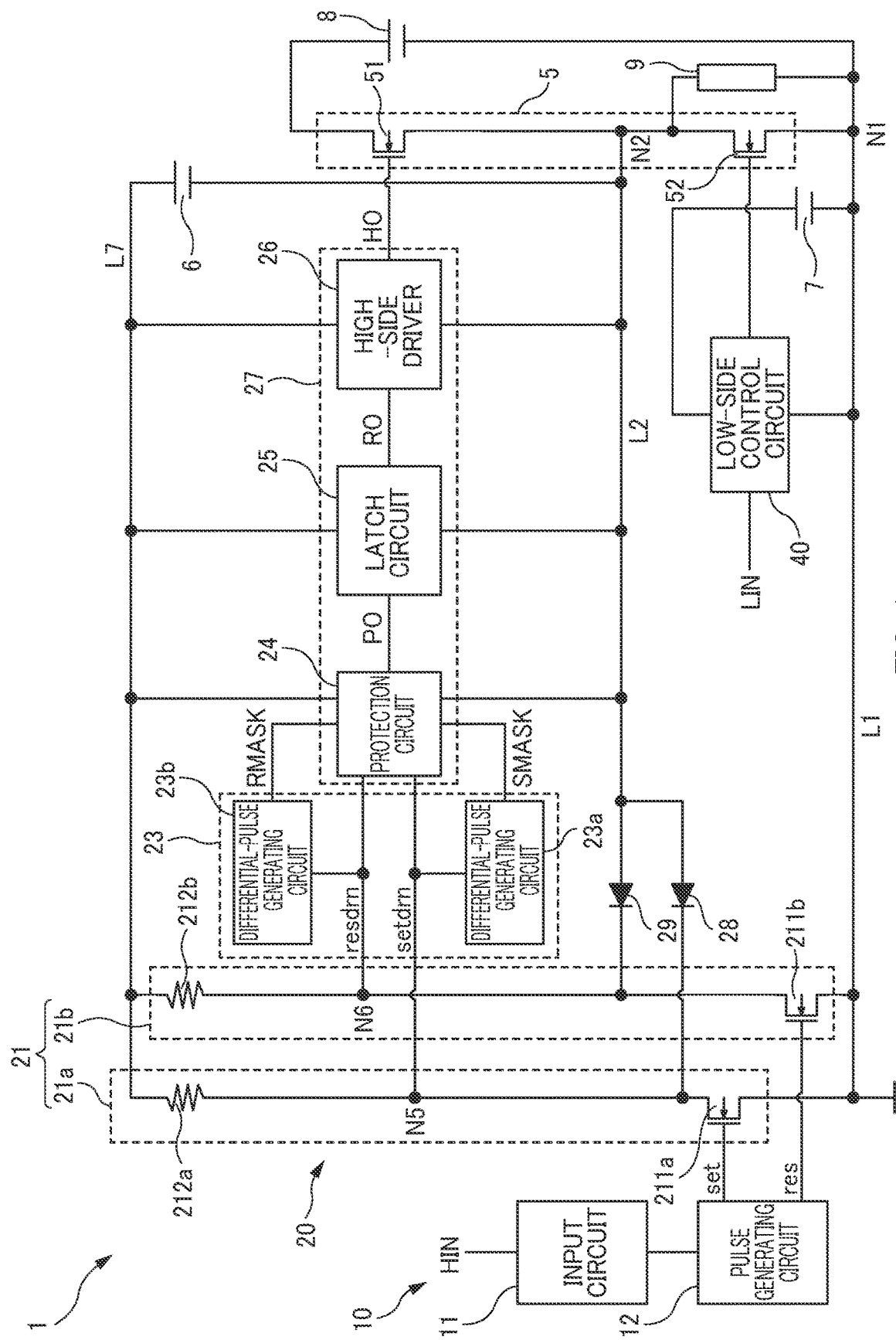
FIG. 1 is a diagram illustrating a configuration of a drive circuit according to a first embodiment, along with an output circuit, a load, and a power supply.
Figure 2:
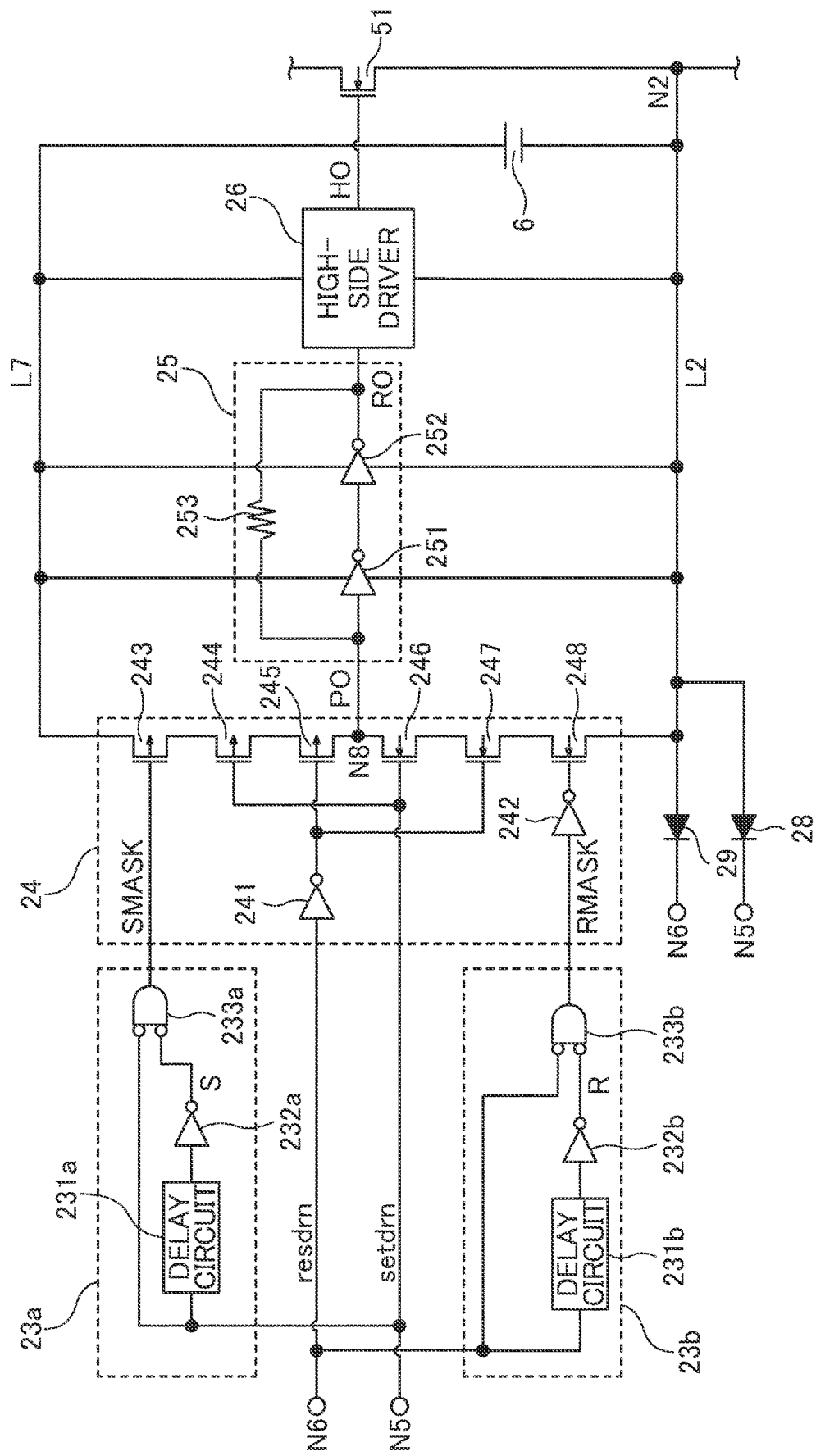
FIG. 2 is a drawing for explaining a configurations of a mask-signal generating circuit and a control circuit according to a first embodiment.
Figure 3:
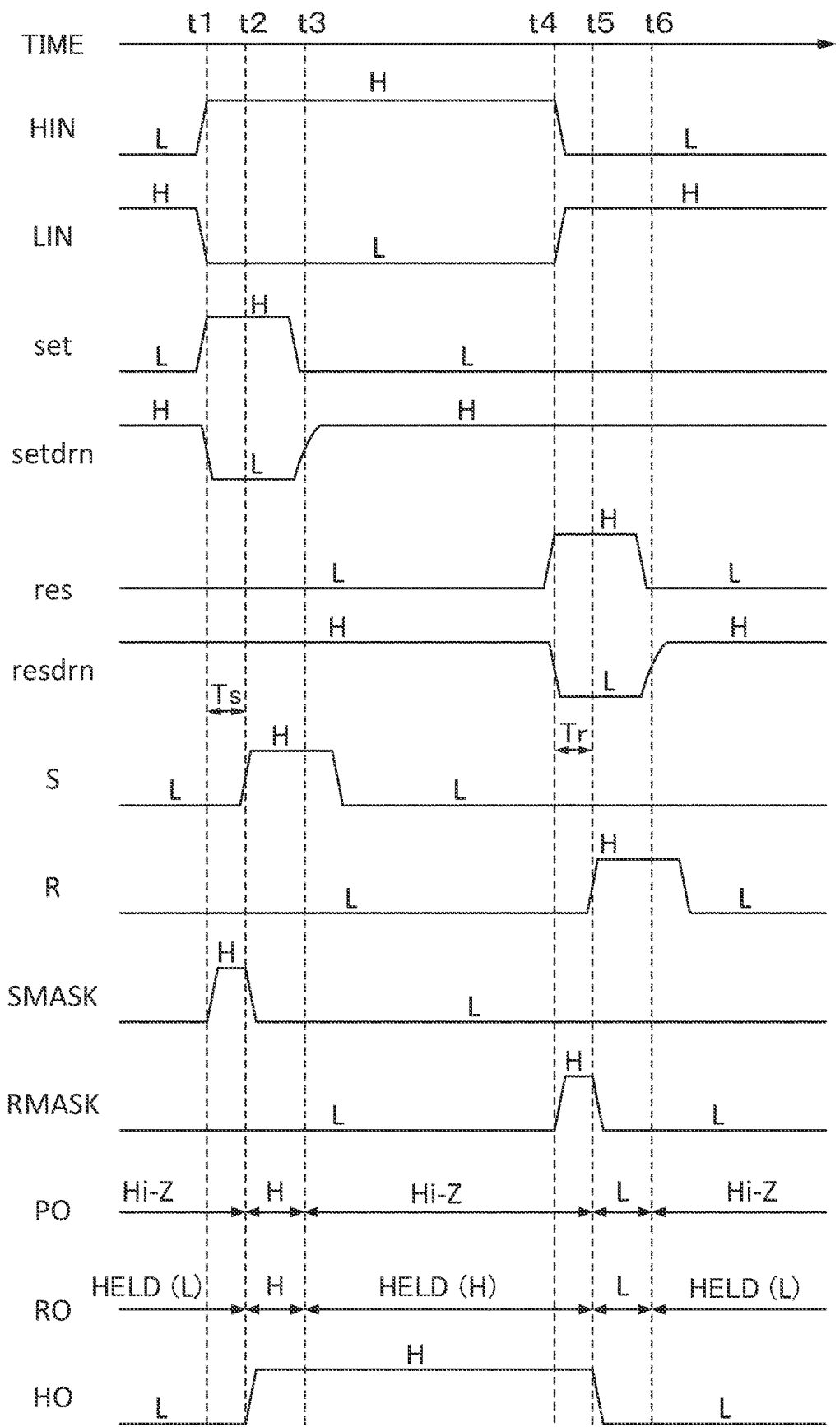
FIG. 3 is a timing chart illustrating waveforms of a high-side input signal, a low-side input signal, a set signal, a level-shifted set signal, a reset signal, a level-shifted reset signal, an output signal of a set-side inverter, an output signal of a reset-side inverter, a set-side mask signal, a reset-side mask signal, an output of a protection circuit, an output signal of a latch circuit, and a drive signal.

FIG. 1 is a diagram illustrating a drive circuit 1, an output circuit 5, and a load 9. FIG. 2 is a diagram for explaining configurations of differential-pulse generating circuits 23a and 23b, a protection circuit 24, and a latch circuit 25. FIG. 3 is a timing chart illustrating a relationship among an input signal HIN, an input signal LIN, a set signal set, a level-shifted set signal setdrn, a reset signal res, a level-shifted reset signal resdrn, an output signal S, an output signal R, a mask signal SMASK, a mask signal RMASK, an output PO, an output signal RO, and a drive signal HO. The waveforms of the signals illustrated in FIG. 3 changes periodically and repeatedly so as to transition from the state at time t1 through the state at time t6 to the state at time t1.

Here, the set signal set and the reset signal res are output signals of a pulse generating circuit 12. The level-shifted set signal setdrn is an output signal of a set-side level shift circuit 21a. The level-shifted reset signal resdrn is an output signal of a reset-side level shift circuit 21b. The output signal S is an output signal of an inverter 232a. The output signal R is an output signal of an inverter 232b. The mask signal SMASK is an output signal of a mask-signal generating circuit 23, and is also an output signal of a set-side differential-pulse generating circuit 23a. The mask signal RMASK is an output signal of the mask-signal generating circuit 23, and is also an output signal of a reset-side differential-pulse generating circuit 23b. The output PO is an output of the protection circuit 24. The output signal RO is an output signal of the latch circuit 25.

The drive circuit 1 is operated by receiving a high-side input signal HIN and a low-side input signal LIN from a microcomputer (not illustrated). The input signal HIN and the input signal LIN are logic input signals which repeatedly change between a first logic level and a second logic level. Here, the first logic level refers to a low level and the second logic level refers to a high level.

The input signal HIN and the input signal LIN have a relationship complementary to each other. Specifically, when the input signal HIN is high, the input signal LIN is low, and when the input signal HIN is low, the input signal LIN is high. In such control, there is also a case where both the input signal HIN and the input signal LIN are low.

When the drive circuit 1 drives the output circuit 5 in response to the high-side input signal HIN and the low-side input signal LIN, the output circuit 5 repeatedly and alternately switches a state of the load 9 between a voltage applied state in which a voltage of a high-voltage direct-current (DC) power supply 8 is applied to the load 9 and a ground voltage applied state in which a ground voltage is applied to the load 9.

The output circuit 5 includes power switching devices 51, 52 constituting a half bridge. The power switching devices 51 and 52 are N-channel power metal-oxide-semiconductor field-effect transistors (MOSFETs) but may be power devices such as insulated-gate bipolar transistors (IGTBs), bipolar transistors or the like. The power switching devices 51 and 52 are coupled in series between a high-potential output terminal and a low-potential output terminal of a high-voltage DC power supply 8. A node N1 between the power switching device 52 and the low-potential output terminal of the high-voltage DC power supply 8 is grounded via a low-side reference-potential line L1, and thus the node N1 is set to a low-side reference potential. A node N2 between the power switching device 51 and the power switching device 52 is coupled to one end of the load 9. The other end of the load 9 is grounded and thus set to the reference potential. The node N2 is coupled to the low-potential output terminal of a high-side DC power supply 6 via a high-side reference-potential line L2. The high-potential output terminal of the high-side DC power supply 6 is coupled to a high-potential line L7, and thus, the output voltage of the high-side DC power supply 6 using the potential of the node N2 as a reference is applied to the high-potential line L7.

The drive circuit 1 generates the drive signal HO, which is a logic signal, based on the high-side input signal HIN, and outputs the drive signal HO to the gate of the power switching device 51. This causes the power switching device 51 to be on when the drive signal HO is high, and causes the power switching device 51 to be off when the drive signal HO is low. Furthermore, the drive circuit 1 turns on and off the power switching device 52 complementarily to the power switching device 51 in response to the low-side input signal LIN. When the power switching device 51 is on and the power switching device 52 is off, the potential of the node N2 results in the output voltage of the high-voltage DC power supply 8 and the load 9 is in the voltage applied state. When the power switching device 51 is off and the power switching device 52 is on, the potential of the node N2 results in the reference potential and the load 9 is in the ground voltage applied state. Accordingly, the potential of the node N2 can vary between the reference potential and the output voltage of the high-voltage DC power supply 8. Note that the load 9 shifts from the voltage applied state to the ground voltage applied state through a dead time. In the dead time, both of the power switching devices 51, 52 are off to avoid short circuit and through current in the high-voltage DC power supply 8. Similarly, the load 9 shifts from the ground voltage applied state to the voltage applied state through a dead time.

2. Configuration of Drive Circuit

The drive circuit 1 includes a preceding-stage circuit 10, a subsequent-stage circuit 20, and the low-side control circuit 40.

The drive circuit 1 is built in a single chip. However, the drive circuit 1 may be configured such that the preceding-stage circuit 10 and the subsequent-stage circuit 20 are built in the same chip and the low-side control circuit 40 is built in another chip. Alternatively, the drive circuit 1 may be configured such that the preceding-stage circuit 10 and the low-side control circuit 40 are built in the same chip and the subsequent-stage circuit 20 is built in another chip. The drive circuit 1 may be configured such that the subsequent-stage circuit 20 and the low-side control circuit 40 are built in the same chip and the preceding-stage circuit 10 is built in another chip. As another alternative, the drive circuit 1 may be configured such that the preceding-stage circuit 10, the subsequent-stage circuit 20, and the low-side control circuit 40 are built in separate chips, respectively.

The preceding-stage circuit 10 and the low-side control circuit 40 are circuits of low-voltage systems, and the subsequent-stage circuit 20 is a circuit of a high-voltage system. In other words, the preceding-stage circuit 10 and the low-side control circuit 40 operate at a low voltage, and the subsequent-stage circuit 20 operates at a high voltage.

The preceding-stage circuit 10 includes an input circuit 11 and the pulse generating circuit 12. The subsequent-stage circuit 20 includes a level shift circuit 21, the mask-signal generating circuit 23, a control circuit 27, and diodes 28 and 29. The mask-signal generating circuit 23 includes the set-side differential-pulse generating circuit 23a and the reset-side differential-pulse generating circuit 23b. The control circuit 27 includes the protection circuit 24 serving as a latch control circuit, the latch circuit 25, and a high-side driver 26 serving as a drive-signal output circuit.

<<<2-1. Low-Side Control Circuit>>>

The low-side control circuit 40 is supplied with power from a low-side DC power supply 7 and receives the input signal LIN from a microcomputer. The low-side control circuit 40 outputs a drive signal to the power switching device 52 in response to the input signal LIN, to turn on and off the power switching device 52 complementarily relative to the power switching device 51. The drive signal outputted by the low-side control circuit 40 is delayed relative to the input signal LIN. The delay time in the low-side control circuit 40 is designed according to the delay time in delay circuits 231a and 231b which will be described later (specifically, a time period during which the mask signal SMASK or the mask signal RMASK is high).

<<<2-2. Input Circuit>>>

The input circuit 11 includes a comparator that compares the input signal HIN with a reference voltage to determine whether the input signal HIN is high or low, and a noise filter that removes noise from the output signal of the comparator and outputs a resultant signal. When the input signal HIN is high, the output signal of the input circuit 11 is high, and when the input signal HIN is low, the output signal of the input circuit 11 is low. Since the noise filter is, for example, a low-pass filter, a signal delay occurs in the input circuit 11, which causes the output signal of the input circuit 11 to be delayed from the input signal HIN.

<<<2-3. Pulse Generating Circuit>>>

The pulse generating circuit 12 outputs the set signal set (see FIG. 3) that changes in a pulsed shape and goes high when the output signal of the input circuit 11 rises from low to high. The pulse generating circuit 12 also outputs the reset signal res (see FIG. 3) that changes in a pulsed shape and goes high when the output signal of the input circuit 11 falls from high to low. The timing in which the set signal set is high is different from the timing in which the reset signal res is high. The set signal set and the reset signal res are inputted to the level shift circuit 21 of the subsequent-stage circuit 20.

<<<2-4. Level Shift Circuit and Clamp Diodes>>>

As illustrated in FIG. 1, the level shift circuit 21 includes the set-side level shift circuit 21a and the reset-side level shift circuit 21b. The set-side level shift circuit 21a inverts the set signal set outputted by the pulse generating circuit 12 and also shifts the DC level of the set signal set, and then outputs a resultant signal, as the level-shifted set signal setdrn (see FIG. 3), to the mask-signal generating circuit 23 and the control circuit 27. The reset-side level shift circuit 21b inverts the reset signal res outputted by the pulse generating circuit 12 and also shifts the DC level of the reset signal res, and then outputs a resultant signal, as the level-shifted reset signal resdrn (see FIG. 3), to the mask-signal generating circuit 23 and the control circuit 27.

The set-side level shift circuit 21a includes a set-side level shift switching device 211a and a resistor 212a. The reset-side level shift circuit 21b includes a reset-side level shift switching device 211b and a resistor 212b.

The level shift switching devices 211a and 211b are high-voltage N-channel MOSFETs, but may be IGTBs or bipolar transistors.

The resistor 212a and the level shift switching device 211a are coupled in series between the high-potential line L7 and the low-side reference-potential line L1. Specifically, the drain of the level shift switching device 211a is coupled to the high-potential line L7 via the resistor 212a. The source of the level shift switching device 211a is coupled to the reference-potential line L1, and the source voltage results in the reference potential.

The resistor 212b and the level shift switching device 211b are coupled in series between the high-potential line L7 and the low-side reference-potential line L1. Specifically, the drain of the level shift switching device 211b is coupled to the high-potential line L7 via the resistor 212b. The source of the level shift switching device 211b is coupled to the reference-potential line L1, and the source voltage results in the reference potential.

The anode of the diode 28 is coupled to the reference-potential line L2, and the cathode of the diode 28 is coupled to the node N5 between the resistor 212a and the level shift switching device 211a. Since the diode 28 clamps the potential of the node N5 at the potential of the reference-potential line L2, the voltage at the node N5 uses the potential of the reference-potential line L2 as its reference. This prevents an overvoltage from being inputted to the mask-signal generating circuit 23 and the control circuit 27.

The anode of the diode 29 is coupled to the reference-potential line L2, and the cathode of the diode 29 is coupled to the node N6 between the resistor 212b and the level shift switching device 211b. Since the diode 29 clamps the potential of the node N6 at the potential of the reference-potential line L2, the voltage at the node N6 uses the potential of the reference-potential line L2 as its reference. This prevents an overvoltage from being inputted to the mask-signal generating circuit 23 and the control circuit 27.

The gate of the level shift switching device 211a is coupled to the set-side output terminal of the pulse generating circuit 12. The set signal set outputted by the pulse generating circuit 12 is inputted to the gate of the level shift switching device 211a. The level shift switching device 211a is turned on and off in response to the set signal set. When the level shift switching device 211a is turned off, the drain voltage (voltage at the node N5) is pulled up to high by the high-side DC power supply 6. When the level shift switching device 211a is turned on, the voltage at the node N5 is pulled down to low by the ground. The voltage at the node N5 is inputted to the mask-signal generating circuit 23 and the control circuit 27 as the level-shifted set signal setdrn.

The gate of the level shift switching device 211b is coupled to the reset-side output terminal of the pulse generating circuit 12. The reset signal res outputted by the pulse generating circuit 12 is inputted to the gate of the level shift switching device 211b. The level shift switching device 211b is turned on and off in response to the reset signal res. When the level shift switching device 211b is turned off, the voltage at the node N6 is pulled up to high by the high-side DC power supply 6. When the level shift switching device 211b is turned on, the voltage at the node N6 is pulled down to low by the ground. The voltage at the node N6 is inputted to the mask-signal generating circuit 23 and the control circuit 27 as the level-shifted reset signal resdrn.

The timing in which the set signal set is high is different from the timing in which the reset signal res is high. Hence, timing in which the level-shifted set signal setdrn is low is also different from the timing in which the level-shifted reset signal resdrn is low. In FIG. 3, the timing at which the level-shifted set signal setdrn falls is time t1, the timing at which the level-shifted set signal setdrn rises is time t3, the timing at which the level-shifted reset signal resdrn falls is time t4, and the timing at which the level-shifted reset signal resdrn rises is time t6.

<<<2-5. Mask-Signal Generating Circuit>>>

The mask-signal generating circuit 23 generates the set-side mask signal SMASK that changes in a pulsed shape in response to a change in the voltage at the node N5, such as a falling change of the level-shifted set signal setdrn, and outputs the mask signal SMASK to the protection circuit 24 of the control circuit 27.

The mask-signal generating circuit 23 generates the reset-side mask signal RMASK that changes in a pulsed shape in response to a change in the voltage at the node N6, such as a falling change of the level-shifted reset signal resdrn, and outputs the mask signal RMASK to the protection circuit 24 of the control circuit 27.

Hereinafter, a description will be given of the differential-pulse generating circuit 23a and the reset-side differential-pulse generating circuit 23b of the mask-signal generating circuit 23. Here, for convenience, a description will be given of the differential-pulse generating circuit 23a at the time of a falling change of the level-shifted set signal setdrn as an example of a change in the voltage at the node N5. Also, a description will be given of the differential-pulse generating circuit 23b at the time of a falling change of the level-shifted set signal setdrn as an example of a change in the voltage at the node N6.

<<<2-5-1. Set-Side Differential-Pulse Generating Circuit>>>

The set-side differential-pulse generating circuit 23a generates the mask signal SMASK (see FIG. 3) that changes in a pulsed shape in response to the falling change of the level-shifted set signal setdrn, and outputs the mask signal SMASK to the protection circuit 24 of the control circuit 27. Here, the time period during which the differential-pulse generating circuit 23a causes the mask signal SMASK to be high is shorter than the time period during which the pulse generating circuit 12 causes the set signal to be high (the time period during which the level-shifted set signal setdrn is low).

The set-side differential-pulse generating circuit 23a includes the set-side delay circuit 231a, the inverter 232a, and a NOR gate 233a.

The delay circuit 231a and the NOR gate 233a receive the level-shifted set signal setdrn. The delay circuit 231a delays the level-shifted set signal setdrn and outputs a resultant signal to the inverter 232a. The inverter 232a inverts the output signal of the delay circuit 231a and outputs a resultant signal to the NOR gate 233a. The NOR gate 233a calculates the negative OR of the output signal S of the inverter 232a and the level-shifted set signal setdrn, and outputs the mask signal SMASK representing the negative OR to the protection circuit 24. Here, the output signal S of the inverter 232a is obtained by delaying and inverting the level-shifted set signal setdrn. Thus, during a time period Ts from time t1 when the level-shifted set signal setdrn falls to time t2 when the output signal S of the inverter 232a rises, the mask signal SMASK is high.

The delay time of the delay circuit 231a, in other words, the time period Ts during which the mask signal SMASK is high is shorter than the time period during which the pulse generating circuit 12 causes the set signal set to be high (the time period during which the level-shifted set signal setdrn is low).

<<<2-5-2. Reset-Side Differential-Pulse Generating Circuit>>>

The reset-side differential-pulse generating circuit 23b generates the reset-side mask signal RMASK (see FIG. 3) that changes in a pulsed shape in response to the falling change of the level-shifted reset signal resdrn, and outputs the mask signal RMASK to the protection circuit 24. Here, the time period during which the differential-pulse generating circuit 23b causes the mask signal RMASK to be high is shorter than the time period during which the pulse generating circuit 12 causes the reset signal res to be high (the time period during which the level-shifted reset signal resdrn is low).

The reset-side differential-pulse generating circuit 23b includes the reset-side delay circuit 231b, the inverter 232b, and a NOR gate 233b.

The delay circuit 231b and the NOR gate 233b receive the level-shifted reset signal resdrn. The delay circuit 231b delays the level-shifted reset signal resdrn, and outputs a resultant signal to the inverter 232b. The inverter 232b inverts the output signal of the delay circuit 231b and outputs a resultant signal to the NOR gate 233b. The NOR gate 233b calculates the negative OR of the output signal R of the inverter 232b and the level-shifted reset signal resdrn, and outputs the mask signal RMASK representing the negative OR to the protection circuit 24 of the control circuit 27. Here, the output signal R of the inverter 232b is obtained by delaying and inverting the level-shifted reset signal resdrn. Thus, during a time period Tr from time t4 when the level-shifted reset signal resdrn falls to time t5 when the output signal R of the inverter 232b rises, the mask signal RMASK is high.

The delay time of the delay circuit 231b, in other words, the time period Tr during which the mask signal RMASK is high is shorter than the time period during which the pulse generating circuit 12 causes the reset signal res to be high (the time period during which the level-shifted reset signal resdrn is low).

Note that a configuration may be such that delay circuit 231a, 231b includes a delay-time adjustment unit and the delay-time adjustment unit is subjected to a process, such that the delay time of the delay circuit 231a, 231b is adjusted in accordance with the use, purpose, usage environment, and/or the like of the drive circuit 1.

<<<2-6. Control Circuit>>>

The control circuit 27 generates the drive signal HO based on the level-shifted set signal setdrn, the level-shifted reset signal resdrn, the mask signal SMASK, and the mask signal RMASK, and outputs the drive signal HO to the gate of the power switching device 51.

Specifically, while the high mask signal SMASK is inputted to the control circuit 27 during the time period from time t1 to time t2, the control circuit 27 keeps, during the time period, the drive signal HO at the level before time t1, in other words, at the low level. After the high mask signal SMASK is inputted to the control circuit 27 during the time period from time t1 to time t2, and when the low level-shifted set signal setdrn is inputted to the control circuit 27 at time t2, the control circuit 27 changes the drive signal HO to high, to turn on the power switching device 51. While the high level-shifted set signal setdrn and the high level-shifted reset signal resdrn and the low mask signal SMASK and the low mask signal RMASK are inputted to the control circuit 27 during the time period from time t3 to time t4, the control circuit 27 causes the drive signal HO to be at the level before time t3, in other words, at the high level, during this time period. While the high mask signal RMASK is inputted to the control circuit 27 during the time period from time t4 to time t5, the control circuit 27 causes the drive signal HO to be at the level before time t4, in other words, at the high level, during this time period. After the high mask signal RMASK is inputted to the control circuit 27 during the time period from time t4 to time t5, and when the low level-shifted reset signal resdrn is inputted to the control circuit 27 at time t5, the control circuit 27 changes the drive signal HO to low, to turn off the power switching device 51. While the high level-shifted set signal setdrn and the high level-shifted reset signal resdrn and the low mask signal SMASK and the low mask signal RMASK are inputted to the control circuit 27 during the time period from time t6 to time t1, the control circuit 27 causes, during the time period, the drive signal HO to be at the level before time t6, in other words, at the low level.

The control circuit 27 includes the protection circuit 24, the latch circuit 25, and the high-side driver 26.

<<<2-6-1. Protection Circuit>>>

The voltage of the high-side DC power supply 6 using the potential of the reference-potential line L2 as its reference is supplied to protection circuit 24. The protection circuit 24 determines the state of the output PO to the latch circuit 25 according to the level-shifted set signal setdrn, the level-shifted reset signal resdrn, the mask signal SMASK, and the mask signal RMASK. Specifically, the protection circuit 24 causes the output PO to be in a high-impedance state while receiving the high mask signal SMASK or the high mask signal RMASK. The time periods in such a state correspond to the time period from time t1 to time t2 and the time period from time t4 to time t5 in FIG. 3.

The protection circuit 24, after receiving the high mask signal SMASK or the high mask signal RMASK, outputs a signal according to the level-shifted set signal setdrn and the level-shifted reset signal resdrn. Specifically, when the level-shifted set signal setdrn is low, and the level-shifted reset signal resdrn is high, the protection circuit 24 outputs a high signal. The time period in such a state corresponds to the time period from time t2 to time t3. In addition, when the level-shifted set signal setdrn is high, and the level-shifted reset signal resdrn is low, the protection circuit 24 outputs a low signal. The time period in such a state corresponds to the time period from time t5 to time t6. In addition, when both the level-shifted set signal setdrn and the level-shifted reset signal resdrn are high, the protection circuit 24 causes the output PO to be in the high-impedance state. The time periods in such a state correspond to the time period from time t3 to time t4 and the time period from time t6 to time t1. The waveforms of the level-shifted set signal setdrn and the level-shifted reset signal resdrn illustrated in FIG. 3 are those in the normal state. Although not illustrated in FIG. 3, if both the level-shifted set signal setdrn and the level-shifted reset signal resdrn are low due to noise and/or the like, the protection circuit 24 causes the output PO to be in the high-impedance state.

The protection circuit 24 includes inverters 241 and 242 and switching devices 243 to 248.

The switching devices 243 to 245 are P-channel MOSFETs, while the switching devices 246 to 248 are N-channel MOSFETs. The switching devices 243 to 248 are arranged from the high-potential line L7 to the reference-potential line L2, and coupled in series between the high-potential line L7 and the reference-potential line L2. In the example of FIG. 2, the source of the switching device 243 is coupled to the high-potential line L7, the drain of the switching device 243 to the source of the switching device 244, the drain of the switching device 244 to the source of the switching device 245, the drain of the switching device 245 to the drain of the switching device 246, the source of the switching device 246 to the drain of the switching device 247, the source of the switching device 247 to the drain of the switching device 248, and the source of the switching device 248 to the reference-potential line L2. Note that the order of the arrangement of the switching devices 243 to 245, which are P-channel MOSFETs, is not limited to the example in FIG. 2, and the order of the arrangement of the switching devices 243 to 245 may be changed without changing the connections of the gates of the switching devices 243 to 245. The same applies to the order of the arrangement of the switching devices 246 to 248, which are N-channel MOSFETs.

A node N8 between the switching device 245 and the switching device 246 is the output node of the protection circuit 24. This node N8 is coupled to the input terminal of the latch circuit 25.

The gate of the switching device 243 is coupled to the output terminal of the NOR gate 233a, and the mask signal SMASK is inputted to the gate of the switching device 243. This causes the switching device 243 to be on when the mask signal SMASK is low, and causes the switching device 243 to be off when the mask signal SMASK is high.

The gates of the switching device 244 and the switching device 246 are coupled to the node N5, and the level-shifted set signal setdrn is inputted to the gates of the switching device 244 and the switching device 246. This causes the switching device 244 to be on and the switching device 246 to be off, when the level-shifted set signal setdrn is low. This also causes the switching device 244 to be off and the switching device 246 to be on, when the level-shifted set signal setdrn is high.

The gates of the switching device 245 and the switching device 247 are coupled to the node N6 via the inverter 241, and an inverted signal of the level-shifted reset signal resdrn is inputted to the gates of the switching device 245 and the switching device 247. This causes the switching device 245 to be off and the switching device 247 to be on, when the level-shifted reset signal resdrn is low. This also causes the switching device 245 to be on and the switching device 247 to be off, when the level-shifted reset signal resdrn is high.

The gate of the switching device 248 is coupled to the output terminal of the NOR gate 233b via the inverter 242, and an inverted signal of the mask signal RMASK is inputted to the gate of the switching device 248. This causes the switching device 248 is on when the mask signal RMASK is low, and causes the switching device 248 is off when the mask signal RMASK is high.

The electrical state of the node N8, in other words, the state of the output PO of the protection circuit 24 is determined by the combinations of ons and offs of the switching devices 243 to 248. When all the switching devices 243 to 245 are on, the voltage at the node N8 is pulled up by the high-side DC power supply 6, and the output PO of the protection circuit 24 is high. When all the switching devices 246 to 248 are on, the voltage at the node N8 is pulled down by the voltage of the reference-potential line L2, and the output PO of the protection circuit 24 is low. When at least one of the switching devices 243 to 245 is off, as well as at least one of the switching devices 246 to 248 is off, the node N8 is in a floating state, and the output PO is in a high-impedance state.

More details will be described with reference to Table 1 and FIG. 3. Table 1 gives a relationship among the level-shifted set signal setdrn, the level-shifted reset signal resdrn, the mask signal SMASK, the mask signal RMASK, the switching devices 243 to 248, and the state of the output PO of the protection circuit 24.

off, and the switching device 247 of the switching devices 246 to 248 is off, and thus the output PO of the protection circuit 24 is in the high-impedance state.

Note that the delay times of the delay circuits 231a and 231b, in other words, the time periods Ts and Tr during which the mask signals SMASK and RMASK are high, respectively, are longer than the response time of the protection circuit 24 for responding to a change in the level of the level-shifted set signal setdrn or the level-shifted reset signal resdrn (i.e., the time period in which the output PO is about to change). Thus, even when the level of the level-shifted set signal setdrn changes at time t1, it is possible to prevent the output PO of the protection circuit 24 from

TABLE 1

| setdrn | resdrn | SMASK | RMASK | SWITCHING DEVICE 243 | SWITCHING DEVICE 244 | SWITCHING DEVICE 245 | SWITCHING DEVICE 246 | SWITCHING DEVICE 247 | SWITCHING DEVICE 248 | PO |
|---|---|---|---|---|---|---|---|---|---|---|
| H | H | don't care | don't care | don't care | OFF | ON | ON | OFF | don't care | Hi-Z |
| L | H | H | L | OFF | ON | ON | OFF | OFF | ON | Hi-Z |
| L | H | L | L | ON | ON | ON | OFF | OFF | ON | H |
| H | L | L | H | ON | OFF | OFF | ON | ON | OFF | Hi-Z |
| H | L | L | L | ON | OFF | OFF | ON | ON | ON | L |
| L | L | don't care | don't care | don't care | ON | OFF | OFF | ON | don't care | Hi-Z |

During the time period from time t1 to time t2, the level-shifted set signal setdrn is low, the level-shifted reset signal resdrn is high, the mask signal SMASK is high, and the mask signal RMASK is low. During this time period, the switching device 243 of the switching devices 243 to 245 is off, and the switching devices 246 and 247 of the switching devices 246 to 248 are off, and thus the output PO of the protection circuit 24 is in the high-impedance state.

During the time period from time t2 to time t3, the level-shifted set signal setdrn is low, the level-shifted reset signal resdrn is high, the mask signal SMASK is low, and the mask signal RMASK is low. Accordingly, all the switching devices 243 to 245 are on, and thus the output PO of the protection circuit 24 is high.

During the time period from time t3 to time t4, the level-shifted set signal setdrn is high, the level-shifted reset signal resdrn is high, the mask signal SMASK is low, and the mask signal RMASK is low. During this time period, the switching device 244 of the switching devices 243 to 245 is off, and the switching device 247 of the switching devices 246 to 248 is off, and thus the output PO of the protection circuit 24 is in the high-impedance state.

During the time period from time t4 to time t5, the level-shifted set signal setdrn is high, the level-shifted reset signal resdrn is low, the mask signal SMASK is low, and the mask signal RMASK is high. Accordingly, the switching devices 244 and 245 of the switching devices 243 to 245 are off, and the switching device 248 of the switching devices 246 to 248 is off, and thus the output PO of the protection circuit 24 is in the high-impedance state.

During the time period from time t5 to time t6, the level-shifted set signal setdrn is high, the level-shifted reset signal resdrn is low, the mask signal SMASK is low, and the mask signal RMASK is low. During this time period, all the switching devices 246 to 248 are on, and thus the output PO of the protection circuit 24 is low.

During the time period from time t6 to time t1, the level-shifted set signal setdrn is high, the level-shifted reset signal resdrn is high, the mask signal SMASK is low, and the mask signal RMASK is low. During this time period, the switching device 244 of the switching devices 243 to 245 is instantaneously changing to high. The same applies to the case where the level of the level-shifted reset signal resdrn changes at time t4.

<<<2-6-1. Latch Circuit>>>

The latch circuit 25 includes inverters 251 and 252 and a resistor 253.

The output voltage of the high-side DC power supply 6 using the potential of the reference-potential line L2 as its reference is supplied to the inverters 251 and 252. The input terminal of the inverter 251 is the input terminal of the latch circuit 25. The input terminal of the inverter 251 is coupled to the node N8. The output terminal of the inverter 251 is coupled to the input terminal of the inverter 252. The resistor 253 is coupled between the output terminal of the inverter 252 and the input terminal of the inverter 251.

When the output PO of the protection circuit 24 is high or low, the latch circuit 25 stores and outputs such a value. When the output PO of the protection circuit 24 changes into the high-impedance state, the latch circuit 25 holds and outputs the value that is stored in the latch circuit 25 immediately before the change of the output PO of the protection circuit 24 into the high-impedance state.

During the time period from time t2 to time t3, the output PO of the protection circuit 24 is high, and thus the output signal RO of the latch circuit 25 is high. During the time period from time t3 to time t5, the output PO of the protection circuit 24 is in the high-impedance state, the output signal RO of the latch circuit 25 is held high. During the time period from time t5 to time t6, the output PO of the protection circuit 24 is low, and thus the output signal RO of the latch circuit 25 is low. During the time period from time t6 to time t2, the output PO of the protection circuit 24 is in the high-impedance state, and thus the output signal RO of the latch circuit 25 is held low.

<<<2-6-2. High-Side Driver>>>

The output voltage of the high-side DC power supply 6 using the potential of the reference-potential line L2 as its reference is supplied to the high-side driver 26. The high-side driver 26 receives the output signal RO of the latch circuit 25. The high-side driver 26 generates the drive signal HO according to the output signal RO of the latch circuit 25 and outputs the drive signal HO to the gate of the power switching device 51. Specifically, the high-side driver 26 causes the drive signal HO to be low when the output signal RO of the latch circuit 25 is low, and causes the drive signal HO to be high when the drive signal HO of the latch circuit 25 is high.

A time delay corresponding to the delay time of the delay circuit 231*a*, 231*b* occurs, however, the sum of the delay time of the input circuit 11 and the delay time of the delay circuit 231*a*, 231*b* is designed as appropriate.

3. When External Noise Occurs

Due to external noise caused by a three-phase current and/or the like, one of the voltages at the node N5 and the node N6 may change with a delay from the other. This may cause the voltages at the node N5 and the node N6 to erroneously drop. Even in such a case, the latch circuit 25 does not malfunction, and the drive signal HO of the high-side driver 26 is held in the state before the occurrence of the external noise. Details will be described below.

Figure 4:
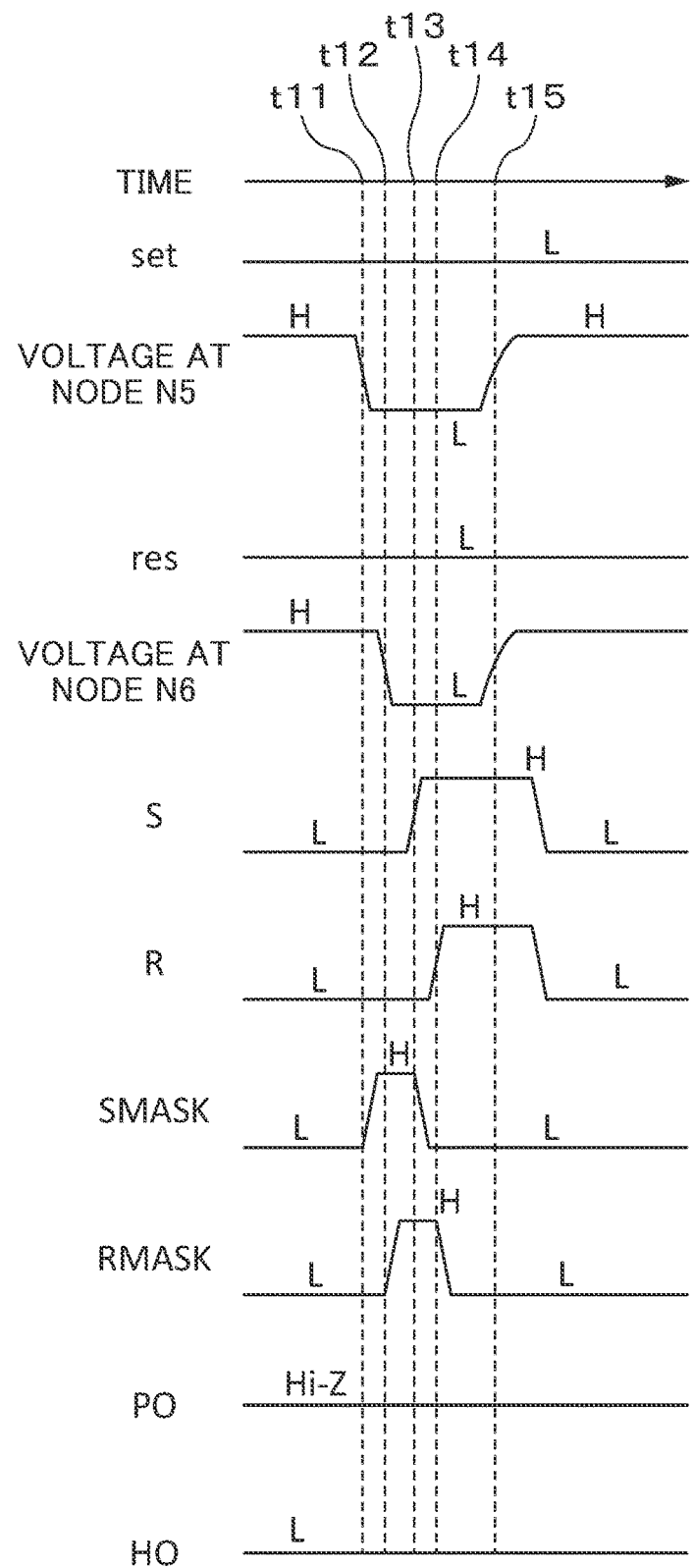
FIG. 4 is a timing chart illustrating waveforms of signals when external noise occurs.

FIG. 4 illustrates a timing chart in the case where external noise occurs during the time period from time t6 to time t1. Before external noise occurs, the level-shifted set signal setdrn (the voltage at the node N5) and the level-shifted reset signal resdrn (the voltage at the node N6) are high, the mask signal SMASK and the mask signal RMASK are low, and the drive signal HO is low. Then, the voltage at the node N5 falls at time t11 due to external noise, and then the voltage at the node N6 also falls with a delay at time t12. Thereafter, both the voltages at the node N5 and the node N6 rise at time t15. Note that the delay times of the delay circuits 231*a* and 231*b* are set longer than the time period from when the voltage at the node N5 falls due to the external noise (at time t11) to when the voltage at the node N6 also falls (at time t12). In addition, the delay times of the delay circuits 231*a* and 231*b* are longer than the response time of the protection circuit 24 for responding to the fall of the voltage at the node N5 or the node N6 due to external noise (i.e., the time period in which the output PO is about to change).

The output signal S of the inverter 232*a* rises at time t13 with a delay after the voltage at the node N5 falls. Thus, during the time period from time t11 to time t13, the mask signal SMASK is high. The output signal R of the inverter 232*b* rises at time t14 with a delay after the voltage at the node N6 falls. Thus, during the time period from time t12 to time t14, the mask signal RMASK is high.

During the time period from time t11 to time t12, the voltage at the node N5 is low, the voltage at the node N6 is high, the mask signal SMASK is high, and the mask signal RMASK is low. During this time period, the switching devices 243, 246, and 247 are off, and thus the output PO of the protection circuit 24 is in the high-impedance state. Accordingly, the output signal RO of the latch circuit 25 is held low, and the drive signal HO also remains low.

During the time period from time t12 to time t15, both the voltages at the node N5 and the node N6 are low, and the mask signal RMASK and the mask signal SMASK are low. During this time period, the switching devices 245 and 246 are off, and thus the output PO of the protection circuit 24 is in the high-impedance state. Accordingly, the output signal RO of the latch circuit 25 is held low, and the drive signal HO also remains low.

After time t15, both the voltages at the node N5 and the node N6 are high. Thus, the switching devices 244 and 247 are off, and the output PO is in the high-impedance state. Accordingly, the output signal RO of the latch circuit 25 is held low, and the drive signal HO also remains low.

Note that, in the case where the voltage at the node N5 falls due to external noise and then the voltage at the node N6 also falls with a delay during the time period from time t6 to time t1 in FIG. 3, as well, the output signal RO of the latch circuit 25 is held low, and the drive signal HO remains low.

Figure 5:
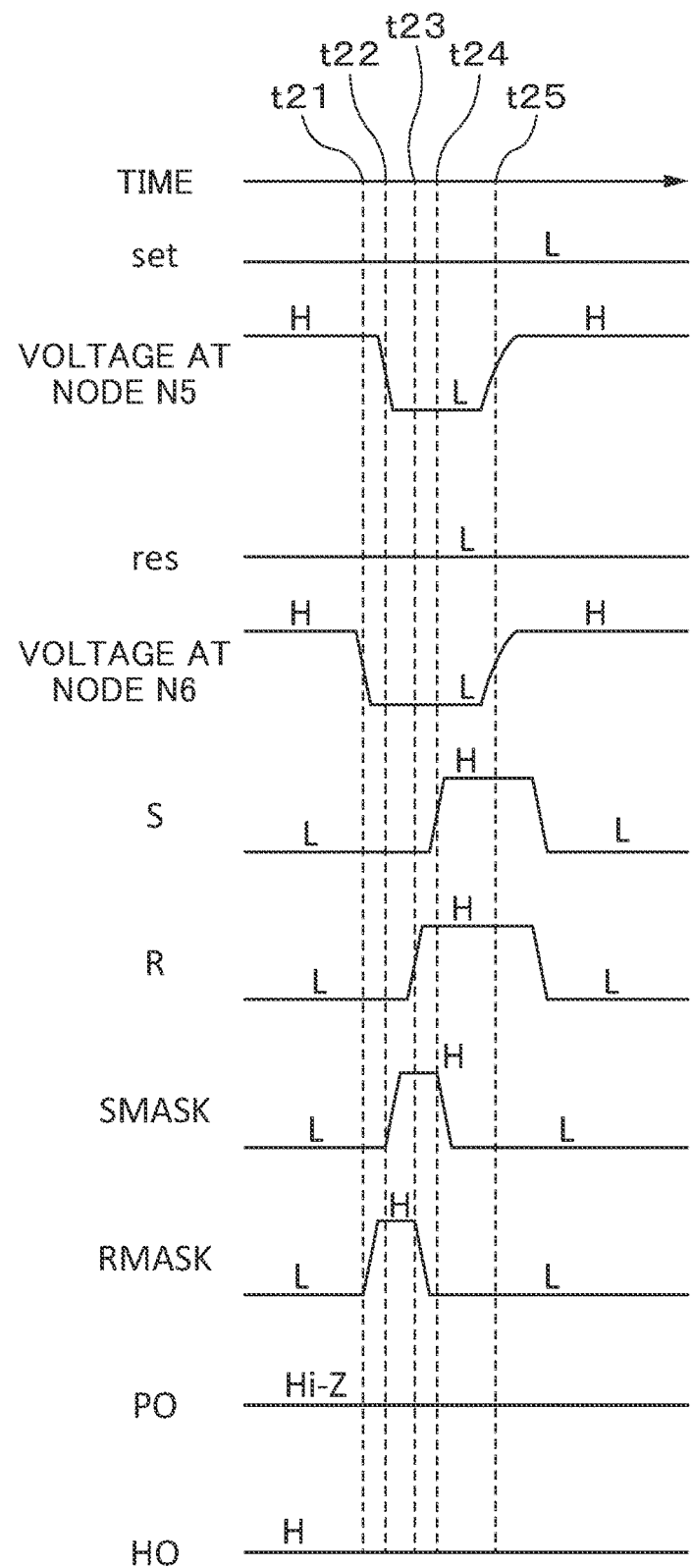
FIG. 5 is a timing chart illustrating waveforms of signals when external noise occurs.

FIG. 5 illustrates a timing chart in the case where external noise occurs during the time period from time t3 to time t4. Before external noise occurs, both the level-shifted set signal setdrn (the voltage at the node N5) and the level-shifted reset signal resdrn (the voltage at the node N6) are high, the mask signal SMASK and the mask signal RMASK are low, and the drive signal HO is high. Then, the voltage at the node N6 falls at time t21 due to external noise, and then the voltage at the node N5 also falls with a delay at time t22. Thereafter, both the voltages at the node N5 and the node N6 rise at time t25. Note that the delay times of the delay circuits 231*a* and 231*b* are set longer than the time period from when the voltage at the node N6 falls (at time t21) due to the external noise to when the voltage at the node N5 also falls (at time t22).

The output signal R of the inverter 232*b* rises at time t23 with a delay after the voltage at the node N6 falls. Thus, during the time period from time t21 to time t23, the mask signal RMASK is high. The output signal S of the inverter 232*a* rises at time t24 with a delay after the voltage at the node N5 falls. Thus, during the time period from time t22 to time t24, the mask signal SMASK is high.

During the time period from time t21 to time t22, the voltage at the node N5 is high, the voltage at the node N6 is low, the mask signal SMASK is low, and the mask signal RMASK is high. During this time period, the switching devices 244, 245, and 248 are off, and thus the output PO of the protection circuit 24 is in the high-impedance state. Accordingly, the output signal RO of the latch circuit 25 is held high, and the drive signal HO also remains high.

During the time period from time t22 to time t25, both the voltages at the node N6 and the node N5 are low. During this time period, the switching devices 245 and 246 are off, and thus the output PO of the protection circuit 24 is in the high-impedance state. Accordingly, the output signal RO of the latch circuit 25 is held high, and the drive signal HO also remains high.

After time t25, both the voltages at the node N5 and the node N6 are high, and the mask signal RMASK and the mask signal SMASK are low. Accordingly, the switching devices 244 and 247 are off, and the output PO is in the high-impedance state. The output signal RO of the latch circuit 25 is held high, and the drive signal HO also remains high.

Note that, in the case where the voltage at the node N6 falls due to external noise and then the voltage at the node N5 also falls with a delay during the time period from time t3 to time t4 in FIG. 3, as well, the output signal RO of the latch circuit 25 is held high, and the drive signal HO remains high.

4. Recapitulation

Even in the case where one of the voltages at the node N5 and the node N6 falls with a delay from the other, and the voltages at the node N5 and the node N6 erroneously fall, due to external noise, the latch circuit 25 does not malfunction, and the drive signal HO is kept in the state before the occurrence of the external noise.

5. Modification Examples

An embodiment of the present disclosure described above is simply to facilitate understanding of the present disclosure and are not in any way to be construed as limiting the present disclosure. The present disclosure may variously be changed or altered without departing from its essential features and encompass equivalents thereof. For example, modifications described in the following (1) and (2) are possible. The following modifications in (1) and (2) may be combined.

(1) First Modification Example

In an embodiment described above, the mask signal SMASK outputted by the differential-pulse generating circuit 23a goes high in response to the falling change of the level-shifted set signal setdrn. In addition, the mask signal RMASK outputted by the differential-pulse generating circuit 23b goes high in response to the falling change of the level-shifted reset signal resdrn.

Figure 6:
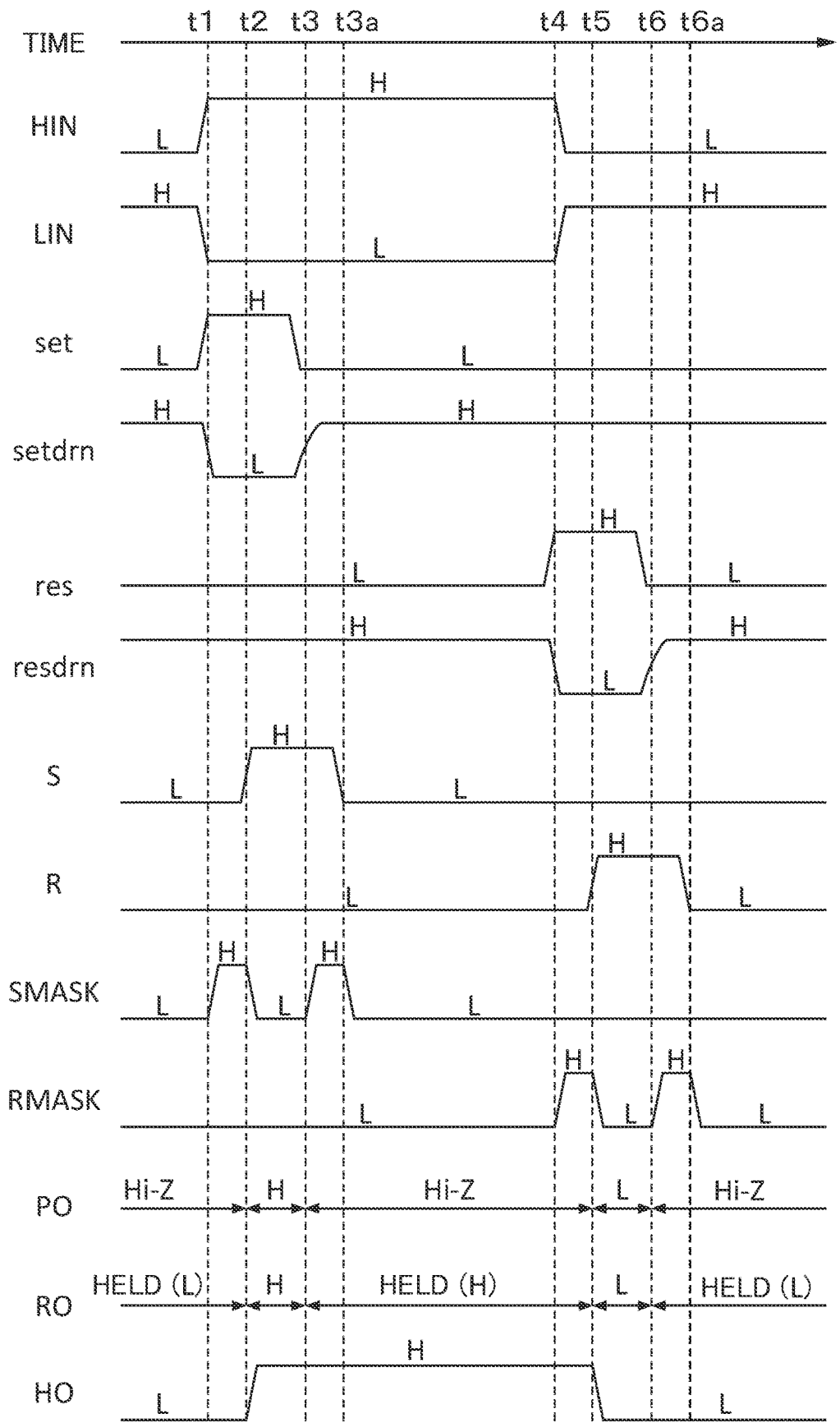
FIG. 6 is a timing chart of a modification example, illustrating waveforms of a high-side input signal, a low-side input signal, a set signal, a level-shifted set signal, a reset signal, a level-shifted reset signal, an output signal of a set-side inverter, an output signal of a reset-side inverter, a set-side mask signal, a reset-side mask signal, an output of a protection circuit, an output signal of a latch circuit, and a drive signal.

Unlike this operation, the mask signal SMASK outputted by the differential-pulse generating circuit 23a may go high in response to not only the falling change of the level-shifted set signal setdrn but also the rising change of the level-shifted set signal setdrn, as in FIG. 6. In addition, the mask signal RMASK outputted by the differential-pulse generating circuit 23b may go high in response to not only the falling change of the level-shifted reset signal resdrn but also the rising change of the level-shifted reset signal resdrn. Note that the waveforms of the signals in FIG. 6 change periodically and repeatedly so as to transition from the state at time t1 through the state at time t6a to the state at time t1.

Figure 7:
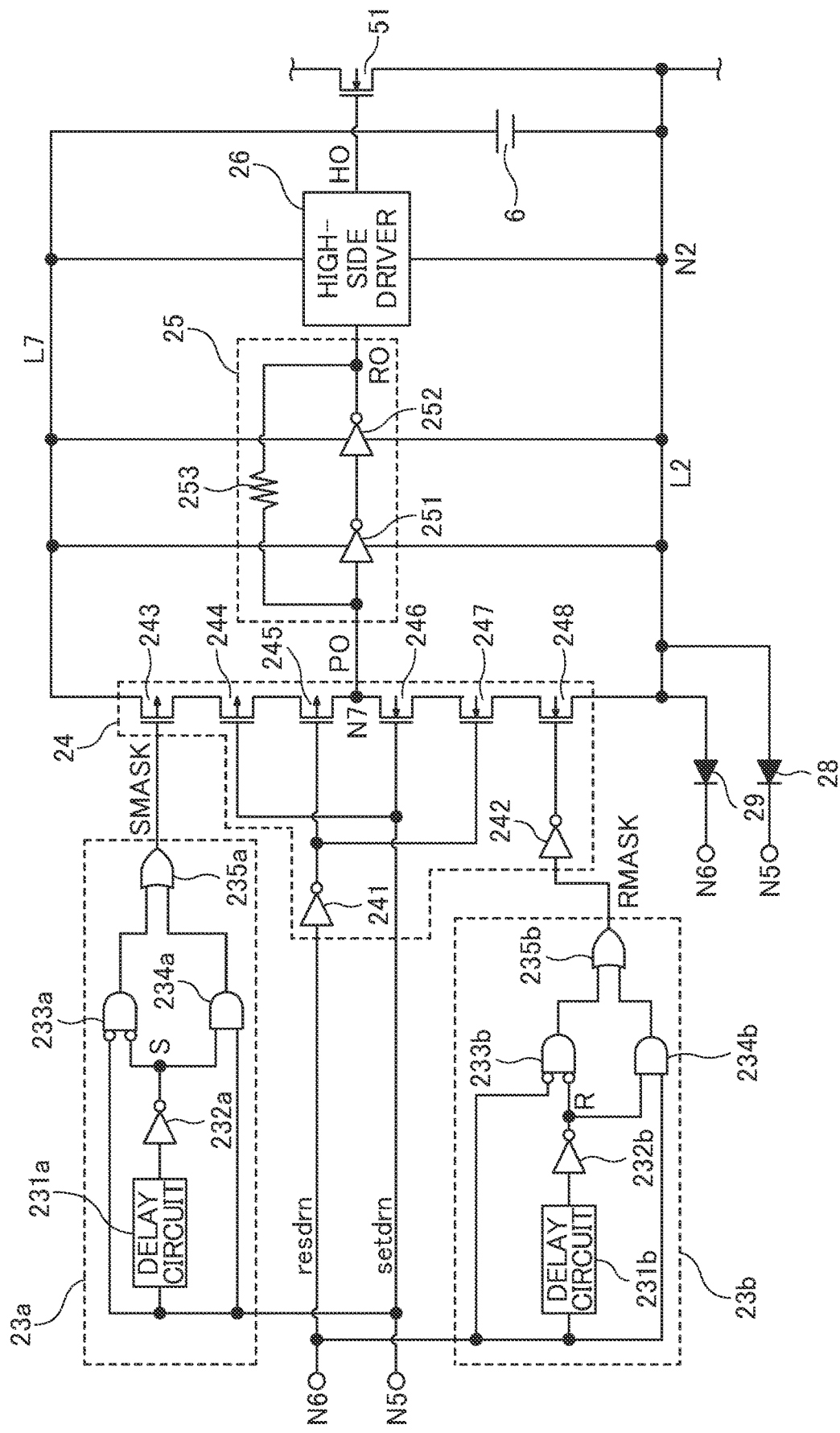
FIG. 7 is a drawing for explaining configurations of a mask-signal generating circuit and a control circuit according to a modification example.

Specifically, the differential-pulse generating circuit 23a and the differential-pulse generating circuit 23b are configured as illustrated in FIG. 7 so as to output the mask signal SMASK and the mask signal RMASK having the waveforms illustrated in FIG. 6.

As illustrated in FIG. 7, the differential-pulse generating circuit 23a includes an AND gate 234a and an OR gate 235a, in addition to the delay circuit 231a, the inverter 232a, and the NOR gate 233a.

The delay circuit 231a, the NOR gate 233a, and the AND gate 234a receive the level-shifted set signal setdrn. The delay circuit 231a delays the level-shifted set signal setdrn and outputs a resultant signal to the inverter 232a. The inverter 232a inverts the output signal of the delay circuit 231a and outputs a resultant signal to the NOR gate 233a and the AND gate 234a. The NOR gate 233a calculates the negative OR of the output signal S of the inverter 232a and the level-shifted set signal setdrn, and outputs a signal representing the negative OR to the OR gate 235a. The AND gate 234a calculates the AND of the output signal S of the inverter 232a and the level-shifted set signal setdrn, and outputs a signal representing the AND to the OR gate 235a. The OR gate 235a calculates the OR of the output signal of the NOR gate 233a and the output signal of the AND gate 234a, and outputs the mask signal SMASK representing the OR to the gate of the switching device 243.

The differential-pulse generating circuit 23b includes an AND gate 234b and an OR gate 235b, in addition to the delay circuit 231b, the inverter 232b, and the NOR gate 233b.

The delay circuit 231b, the NOR gate 233b, and the AND gate 234b receive the level-shifted reset signal resdrn. The delay circuit 231b delays the level-shifted reset signal resdrn and outputs a resultant signal to the inverter 232b. The inverter 232b inverts the output signal of the delay circuit 231b and outputs a resultant signal to the NOR gate 233b and the AND gate 234b. The NOR gate 233b calculates the negative OR of the output signal R of the inverter 232b and the level-shifted reset signal resdrn, and outputs a signal representing the negative OR to the OR gate 235b. The AND gate 234b calculates the AND of the output signal R of the inverter 232b and the level-shifted set signal setdrn, and outputs a signal representing the AND to the OR gate 235b. The OR gate 235b calculates the OR of the output signal of the NOR gate 233b and the output signal of the AND gate 234b, and outputs the mask signal RMASK representing the OR to the gate of the switching device 248.

As illustrated in FIG. 6, when the level-shifted set signal setdrn rises at time t3, the mask signal SMASK rises. Then, after a lapse of the time period corresponding to the delay time of the delay circuit 231a, the mask signal SMASK falls at time t3a. In the time period from time t3 to time t3a, the level-shifted set signal setdrn is high, the level-shifted reset signal resdrn is high, the mask signal SMASK is high, and the mask signal RMASK is low. Thus, the switching device 244 of the switching devices 243 to 245 is off, and the switching device 247 of the switching devices 246 to 248 is off. Accordingly, the output PO is in the high-impedance state, the output signal RO of the latch circuit 25 is held high, and the drive signal HO is high.

When the level-shifted reset signal resdrn rises at time t6, the mask signal RMASK rises. Then, after a lapse of the time period corresponding to the delay time of the delay circuit 231b, the mask signal RMASK falls at time t6a. In the time period from time t6 to time t6a, the level-shifted set signal setdrn is high, the level-shifted reset signal resdrn is high, the mask signal SMASK is low, and the mask signal RMASK is high. The switching device 244 of the switching devices 243 to 245 is off, and the switching device 247 of the switching devices 246 to 248 is off. Accordingly, the output PO is in the high-impedance state, the output signal RO of the latch circuit 25 is held low, and the drive signal HO is low.

In the case where the voltages at the node N5 and the node N6 go high due to external noise, and then, even if one of the voltages at the node N5 and the node N6 falls with a delay from the other, the latch circuit 25 does not malfunction. Details will be described below.

Figure 8:
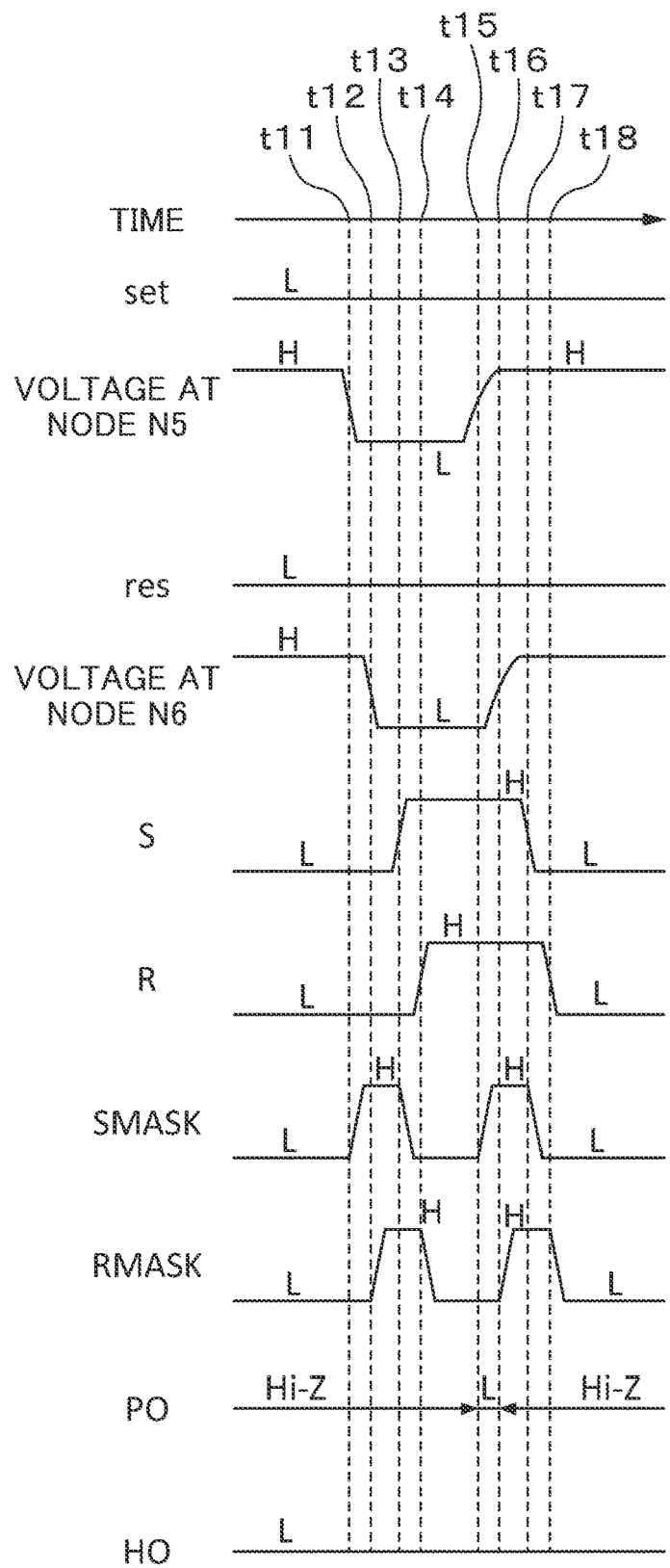
FIG. 8 is a timing chart illustrating waveforms of signals when external noise occurs in a modification example.

FIG. 8 illustrates a timing chart in the case where external noise occurs during the time period from time t6a to time t1. The voltage at the node N5 falls at time t11 due to external noise, and then the voltage at the node N6 also falls with a delay at time t12. Thereafter, the voltage at the node N5 rises at time t15, and then the voltage at the node N6 rises with a delay at time t16.

As has been explained with reference to FIG. 4, during the time period from time t11 to time t15, the output signal RO of the latch circuit 25 is held low, and the drive signal HO is low.

The output signal S of the inverter 232a falls at time t17 with a delay after the voltage at the node N5 rises at time t15. Thus, during the time period from time t15 to time t17, the mask signal SMASK is high. The output signal R of the inverter 232b falls at time t18 with a delay after the voltage at the node N6 rises at time t16. Thus, during the time period from time t16 to time t18, the mask signal RMASK is high.

During the time period from time t15 to time t16, the voltage at the node N5 is high, the voltage at the node N6 is low, the mask signal SMASK is high, and the mask signal RMASK is low. During this time period, the switching devices 243 to 245 are off, and the switching devices 246 to 248 are on, and thus the output PO of the protection circuit 24 is low. Accordingly, the output signal RO of the latch circuit 25 is low, and the drive signal HO remains low.

During the time period from time t16 to time t18, both the voltages at the node N6 and the node N5 are high. During this time period, the switching devices 244 and 247 are off, and thus the output PO of the protection circuit 24 is in the high-impedance state. Thus, the output signal RO of the latch circuit 25 is held low, and the drive signal HO remains low.

Figure 9:
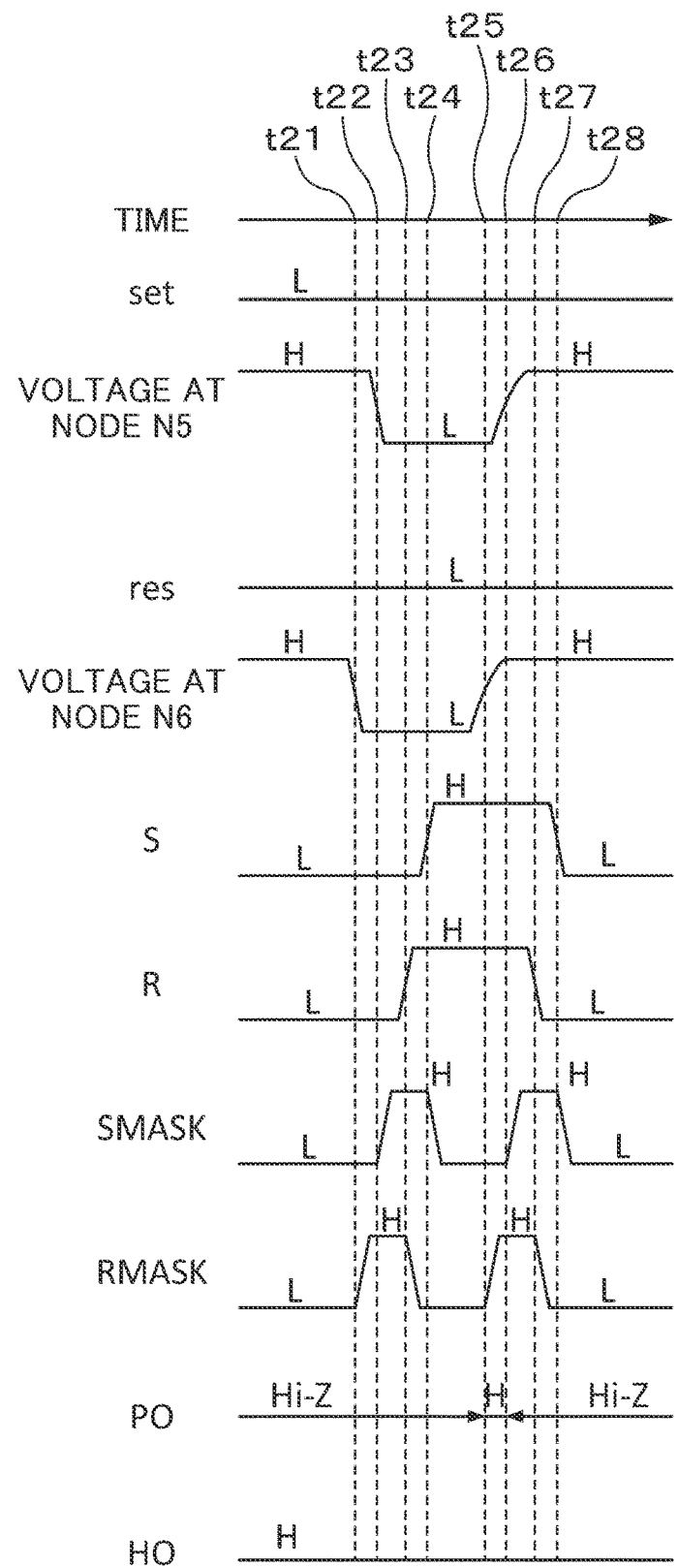
FIG. 9 is a timing chart illustrating waveforms of signals when external noise occurs in a modification example.

FIG. 9 illustrates a timing chart when external noise occurs during the time period from time t3a to time t4. The voltage at the node N6 falls at time t21 due to external noise, and then the voltage at the node N5 also falls with a delay at time t22. Thereafter, the voltage at the node N6 rises at time t25, and then the voltage at the node N5 rises with a delay at time t26.

As has been explained with reference to FIG. 5, during the time period from time t21 to time t25, the output signal RO of the latch circuit 25 is held high, and the drive signal HO is high.

The output signal R of the inverter 232b falls at time t27 with a delay after the voltage at the node N6 rise at time t25. Thus, during the time period from time t25 to time t27, the mask signal RMASK is high. The output signal S of the inverter 232a falls at time t28 with a delay after the voltage at the node N5 rises at time t26. Thus, during the time period from time t26 to time t28, the mask signal SMASK is high.

During the time period from time t25 to time t26, the voltage at the node N5 is low, the voltage at the node N6 is high, the mask signal SMASK is low, and the mask signal RMASK is high. During this time period, the switching devices 243 to 245 are on, and the switching devices 246 to 248 are off, and thus the output PO of the protection circuit 24 is high. Accordingly, the output signal RO of the latch circuit 25 is high, and the drive signal HO remains high.

During the time period from time t26 to time t28, both the voltages at the node N6 and the node N5 are high. During this time period, the switching devices 244 and 247 are off, and thus the output PO of the protection circuit 24 is in the high-impedance state. Accordingly, the output signal RO of the latch circuit 25 is held high, and the drive signal HO remains high.

(2) Second Modification Example

The latch circuit 25 may be a flip-flop circuit. In this case, the node N5 is coupled to the S terminal of the flip-flop via an inverter and the protection circuit 24, the node N6 is coupled to the R terminal of the flip-flop via an inverter and the protection circuit 24, and the Q terminal of the flip-flop is coupled to the high-side driver 26. In this case, the configuration of the protection circuit 24 is different from the one illustrated in FIGS. 1 and 2, and the protection circuit 24 has functions as described below.

The protection circuit 24 does not allow the inverted signals of the level-shifted set signal setdrn and the level-shifted reset signal resdrn to pass therethrough, while receiving the high mask signal SMASK or the high mask signal RMASK. Thus, the inverted signal of the level-shifted set signal setdrn is not outputted from the protection circuit 24 to the S terminal of the flip-flop, and the inverted signal of the level-shifted reset signal resdrn is not outputted from the protection circuit 24 to the R terminal of the flip-flop.

Further, after receiving the high mask signal SMASK or the high mask signal RMASK, the protection circuit 24 does not allow the level-shifted set signal setdrn and the level-shifted reset signal resdrn to pass therethrough through, when both the inverted signals of the level-shifted set signal setdrn and the level-shifted reset signal resdrn are high or low. Thus, the inverted signal of the level-shifted set signal setdrn is not outputted from the protection circuit 24 to the S terminal of the flip-flop, and the inverted signal of the level-shifted reset signal resdrn is not outputted from the protection circuit 24 to the R terminal of the flip-flop.

Further, after receiving the high mask signal SMASK or the high mask signal RMASK, the protection circuit 24 allows the inverted signal of the level-shifted set signal setdrn and the inverted signal of the level-shifted reset signal resdrn to pass therethrough, when one of the level-shifted set signal setdrn and the level-shifted reset signal resdrn is high, and the other thereof is low. Thus, the inverted signal of the level-shifted set signal setdrn is outputted from the protection circuit 24 to the S terminal of the flip-flop, and the inverted signal of the level-shifted reset signal resdrn is outputted to the R terminal of the flip-flop.

The foregoing provision of the protection circuit 24 and flip-flop can also prevent the flip-flop from malfunctioning due to external noise. In other words, even in the case where one of the voltages at the node N5 and the node N6 falls with a delay from the other, and the voltages at the node N5 and the node N6 erroneously fall, due to external noise, the flip-flop does not malfunction, and the drive signal HO is kept in the state before the occurrence of the external noise.

Second Embodiment

The following describes a second embodiment of the present invention with reference to drawings.

1. Outline of Drive Circuit

Figure 10:
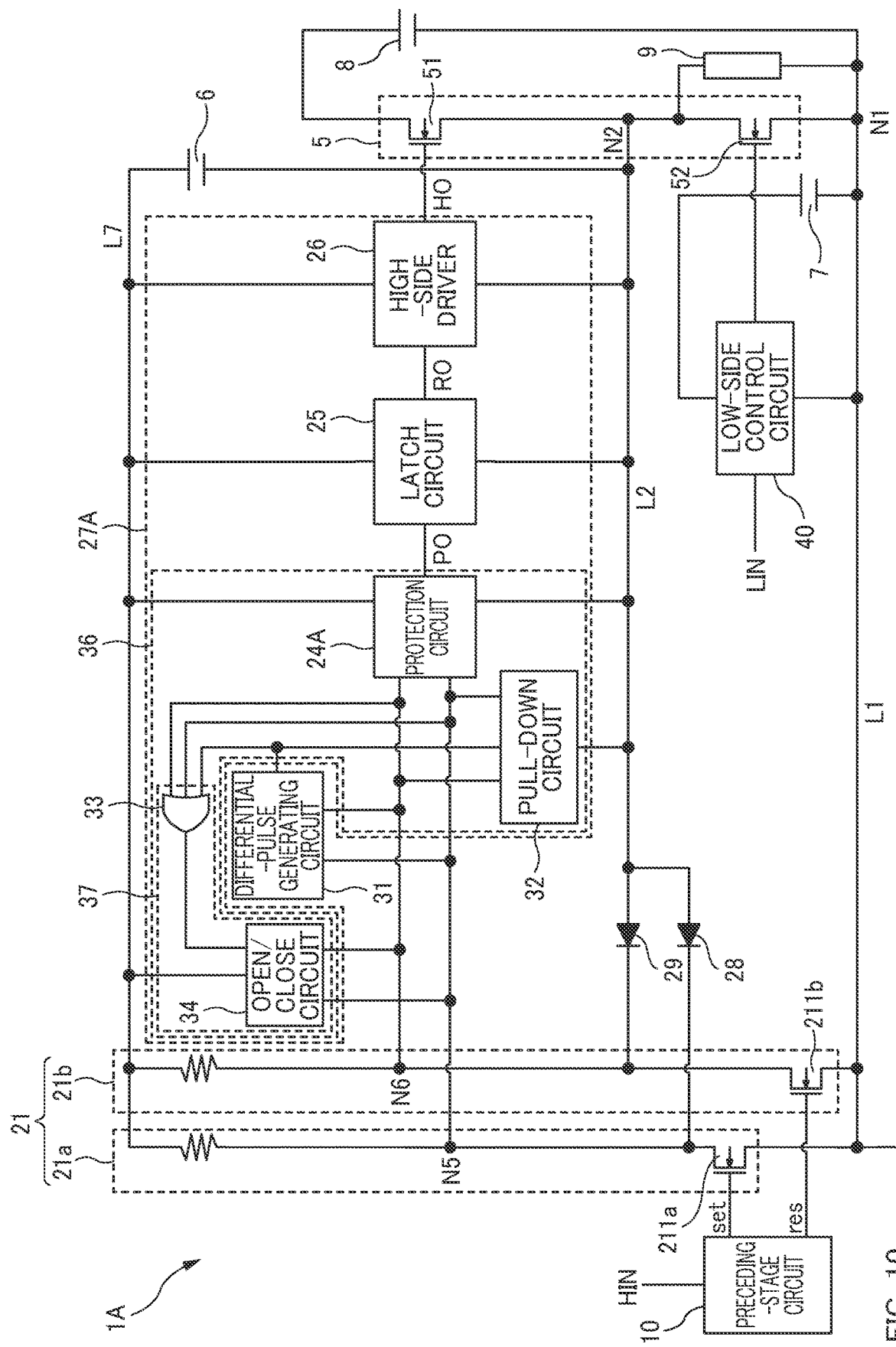
FIG. 10 is a diagram illustrating a configuration of a drive circuit according to a second embodiment, along with an output circuit, a load, and a power supply.
Figure 11:
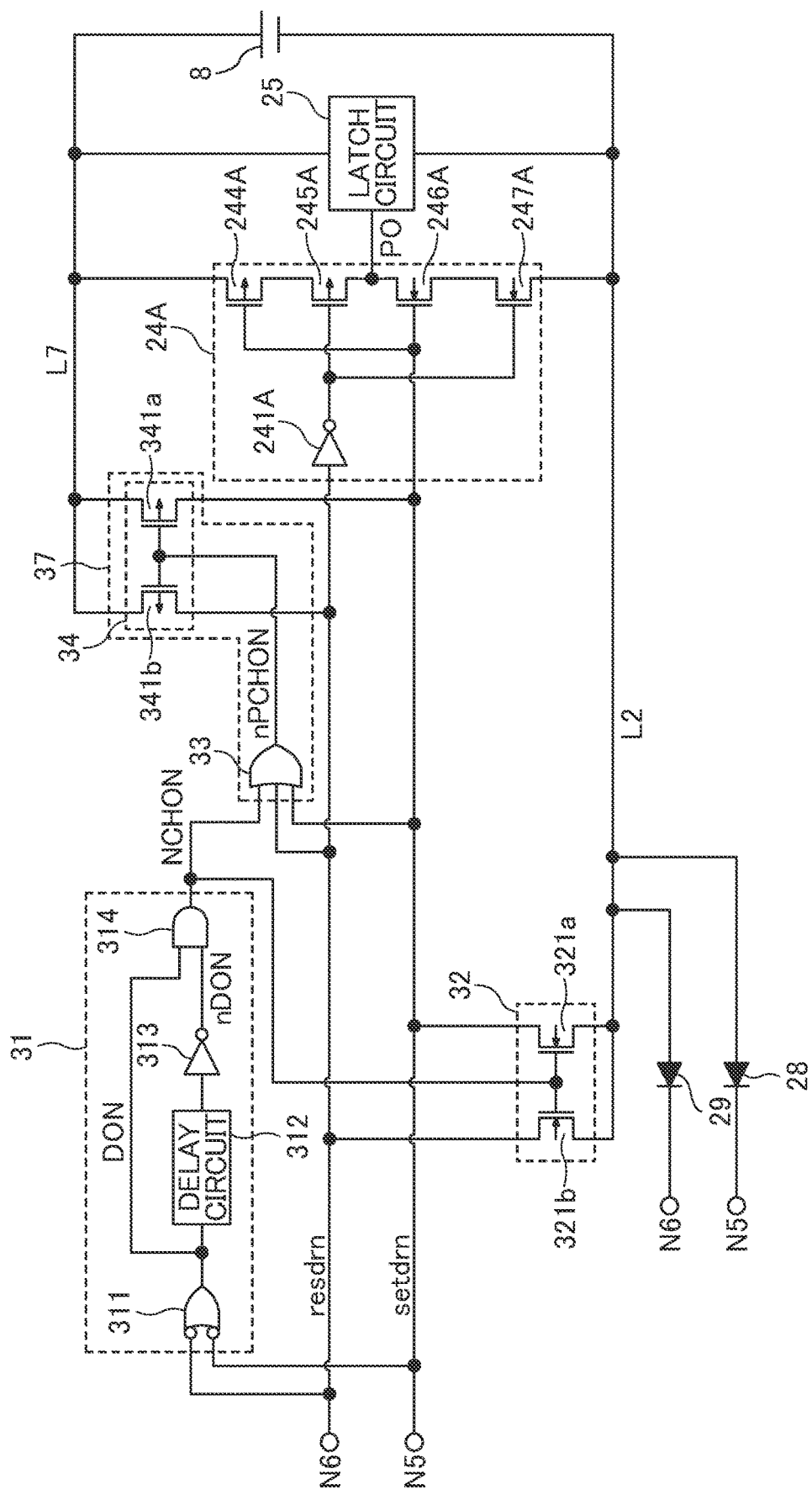
FIG. 11 is a drawing for explaining configurations of a differential-pulse generating circuit, a pull-down circuit, a pull-up circuit, and a protection circuit according to a second embodiment.
Figure 12:
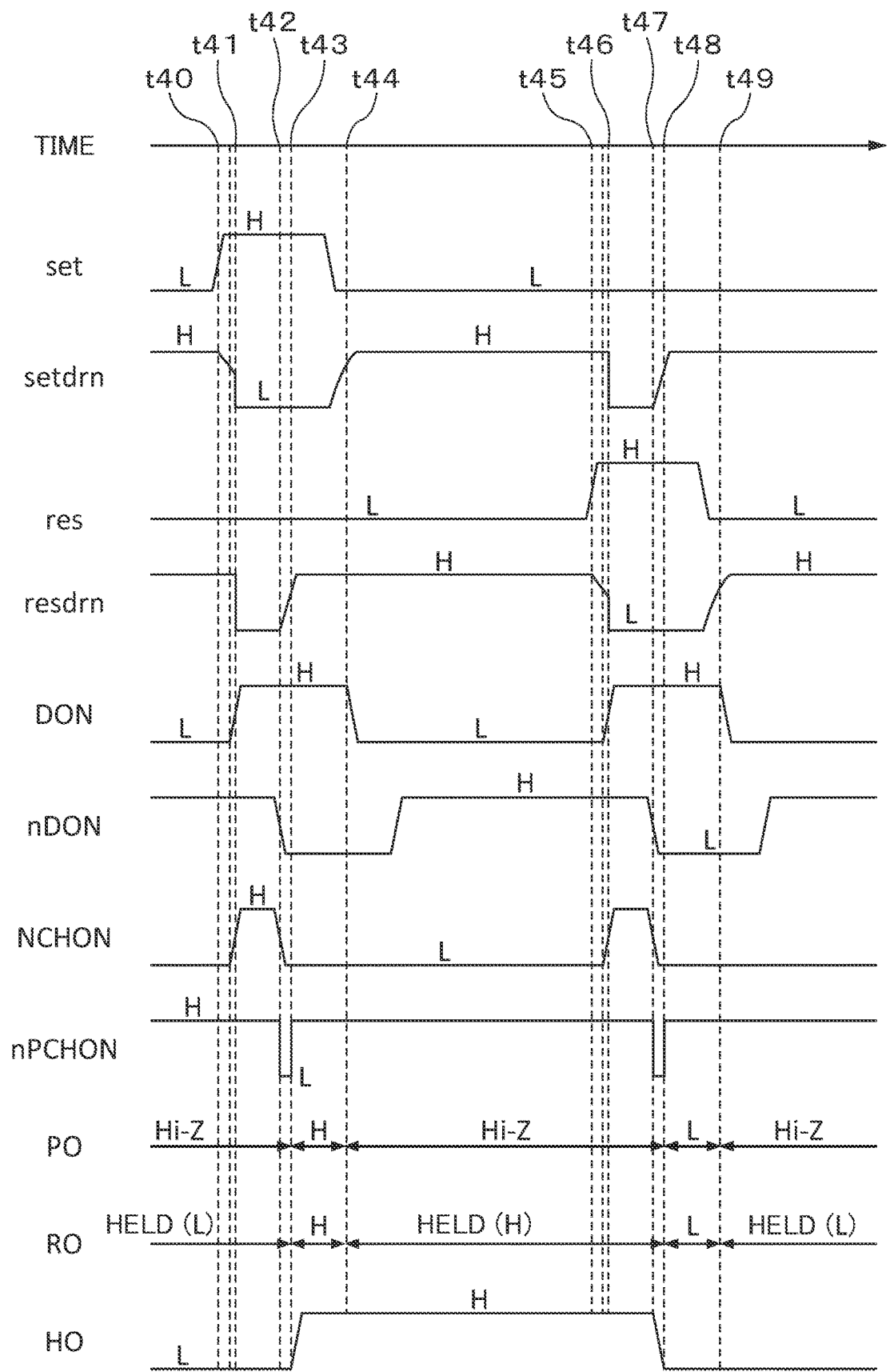
FIG. 12 is a timing chart illustrating waveforms of a set signal, a level-shifted set signal, a reset signal, a level-shifted reset signal, an output signal of a NAND gate, an output signal of an inverter, a mask signal, an output signal of an OR gate, an output of a protection circuit, an output signal of a latch circuit, and a drive signal.

FIG. 10 is a diagram illustrating a drive circuit 1A, the output circuit 5, and the load 9. FIG. 11 is a drawing for explaining the configurations of a differential-pulse generating circuit 31, a pull-down circuit 32, a pull-up circuit 37, and a protection circuit 24A. FIG. 12 is a timing chart illustrating a relationship among the set signal set, the level-shifted set signal setdrn, the reset signal res, the level-shifted reset signal resdrn, an output signal DON, an output signal nDON, a mask signal NCHON, an output signal nPCHON, the output PO, the output signal RO, and the drive signal HO. The waveforms of signals illustrated in FIG. 12 change periodically and repeatedly so as to transition from the state at time t40 through the state at time t49 to the state at time t40. Here, the output circuit 5, the DC power supply 7, the high-side DC power supply 6, the high-voltage DC power supply 8, the load 9, and the low-side control circuit 40 provided in the second embodiment are provided in the same manner as those in the first embodiment. In addition, the constituents common between the drive circuit 1A in the second embodiment and the drive circuit 1 in the first embodiment are denoted by the same reference numerals. The constituents denoted by the same symbols are provided in the same manners and have the same functions. Hence, the constituents of the drive circuit 1A in the second embodiment will be described below mainly as to the differences thereof from those of the drive circuit 1 in the first embodiment.

The drive circuit 1A in the second embodiment includes the preceding-stage circuit 10, the level shift circuit 21, the differential-pulse generating circuit 31 serving as a mask-signal generating circuit, a control circuit 27A, the diodes 28 and 29, and the low-side control circuit 40. The control circuit 27A includes a latch control circuit 36, the latch circuit 25, and the high-side driver 26. The latch control circuit 36 includes the pull-down circuit 32, the pull-up circuit 37, and the protection circuit 24A. Here, the preceding-stage circuit 10, the level shift circuit 21, the latch circuit 25, the high-side driver 26, and the diodes 28 and 29 are the constituents common to those of the drive circuit 1 in the first embodiment, and thus are provided in the same manners as in the first embodiment.

2. Differential-Pulse Generating Circuit

The differential-pulse generating circuit 31 generates the mask signal NCHON that changes in a pulsed shape in response to the change in the voltage at the node N5 or the node N6, such as the falling change of the level-shifted set signal setdrn or the level-shifted reset signal resdrn, and outputs the mask signal NCHON to the pull-down circuit 32 and the pull-up circuit 37. Here, the time period during which the differential-pulse generating circuit 31 causes the mask signal NCHON to be high is shorter than the time period during which the pulse generating circuit 12 causes the set signal set or the reset signal res to be high (the time period during which the level-shifted set signal setdrn or the level-shifted reset signal resdrn is low).

The differential-pulse generating circuit 31 includes a NAND gate 311, a delay circuit 312, an inverter 313, and an AND gate 314.

The NAND gate 311 receives the level-shifted set signal setdrn and the level-shifted reset signal resdrn. The NAND gate 311 calculates the negative AND of the level-shifted set signal setdrn and the level-shifted reset signal resdrn, and outputs the output signal DON representing the negative AND to the delay circuit 312 and the AND gate 314. The delay circuit 312 delays the output signal of the NAND gate 311, and outputs a resultant signal to the inverter 313. The inverter 313 inverts the output signal of the delay circuit 312, and outputs a resultant signal to the AND gate 314. The AND gate 314 calculates the AND of the output signal DON of the NAND gate 311 and the output signal nDON of the inverter 313, and outputs the mask signal NCHON representing the AND to the pull-down circuit 32 and an OR gate 33.

Here, the output signal nDON of the inverter 313 is a signal obtained by delaying and inverting the output signal DON of the NAND gate 311. Thus, in FIG. 12, during the time period from time t41 or t46 at which the output signal DON rises to time t42 or t47 at which the output signal nDON falls, respectively, the mask signal NCHON is high.

3. Control Circuit

The control circuit 27A generates the drive signal HO based on the level-shifted set signal setdrn, the level-shifted reset signal resdrn, and the mask signal NCHON, and outputs the drive signal HO to the gate of the power switching device 51.

Specifically, when the high mask signal NCHON is inputted to the control circuit 27A during the time period from time t41 to time t42, the control circuit 27A causes the drive signal HO to be at the level before time t41, in other words, at the low level, during the time period from time t41 to time t43. After the high mask signal NCHON is inputted to the control circuit 27A during the time period from time t41 to time t42, and when the low level-shifted set signal setdrn is inputted to the control circuit 27A at time t43, the control circuit 27A changes the drive signal HO to high to turn on the power switching device 51. When the high level-shifted set signal setdrn and the high level-shifted reset signal resdrn and the low mask signal NCHON are inputted to the control circuit 27A during the time period from time t44 to time t46, the control circuit 27A causes the drive signal HO to be at the level before time t44, in other words, at the high level, during this time period. After the high mask signal NCHON is inputted to the control circuit 27A during the time period from time t46 to time t47, and when the low level-shifted reset signal resdrn is inputted to the control circuit 27A at time t48, the control circuit 27A changes the drive signal HO to low to turn off the power switching device 51. When the high level-shifted set signal setdrn and the high level-shifted reset signal resdrn and the low mask signal NCHON are inputted to the control circuit 27A in the time period from time t49 to time t41, the control circuit 27A causes the drive signal HO to be at the level before time t49, in other words, at the low level, during this time period.

As described above, the control circuit 27A includes the latch control circuit 36, the latch circuit 25, and the high-side driver 26.

<<<3-1. Latch Control Circuit>>>

The latch control circuit 36 determines the output to the latch circuit 25 according to the level-shifted set signal setdrn, the level-shifted reset signal resdrn, and the mask signal NCHON. Specifically, the latch control circuit 36 causes the output PO to be in the high-impedance state, while receiving the high mask signal NCHON. The time periods in such a state correspond to the time period from time t41 to time t42 and the time period from time t46 to time t47 in FIG. 12.

Further, after receiving the high mask signal NCHON, the latch control circuit 36 outputs a signal according to the level-shifted set signal setdrn and the level-shifted reset signal resdrn. Specifically, when the level-shifted set signal setdrn is low and the level-shifted reset signal resdrn is high after receipt of the high mask signal NCHON, the latch control circuit 36 outputs a high signal. The time period in such a state corresponds to the time period from time t43 to time t44. When the level-shifted set signal setdrn is high and the level-shifted reset signal resdrn is low after receipt of the high mask signal NCHON, the latch control circuit 36 outputs a low signal. The time period in such a state corresponds to the time period from time t48 to time t49. In addition, when both the level-shifted set signal setdrn and the level-shifted reset signal resdrn are low after receipt of the high mask signal NCHON, the latch control circuit 36 causes the output PO to be in the high-impedance state. The time periods in such a state correspond to the time period from time t42 to time t43 and the time period from time t47 to time t48. In addition, when both the level-shifted set signal setdrn and the level-shifted reset signal resdrn are high after receipt of the high mask signal NCHON, the latch control circuit 36 causes the output PO to be in the high-impedance state. The time periods in such a state correspond to the time period from time t44 to time t46 and the time period from time t49 to time t41.

As described above, the latch control circuit 36 includes the pull-down circuit 32, the pull-up circuit 37, and the protection circuit 24A.

<<<3-1-1. Pull-Down Circuit>>>

The pull-down circuit 32 pulls the voltages at the nodes N5 and N6 down to the voltage of the high-side reference-potential line L2 when the output signal of the differential-pulse generating circuit 31, in other words, the mask signal NCHON, is high (for example, when the voltage at the node N5 or the node N6 falls). This causes the pull-down circuit 32 to pull down the voltage levels at the node N5 and the node N6 to low.

The pull-down circuit 32 includes a set-side switching device 321a and a reset-side switching device 321b.

The switching devices 321a and 321b are N-channel MOSFETs. The drain of the switching device 321a is coupled to the node N5, and the source of the switching device 321a is coupled to the reference-potential line L2. The drain of the switching device 321b is coupled to the node N6, and the source of the switching device 321b is coupled to the reference-potential line L2. The gates of the switching devices 321a and 321b are coupled to the output terminal of the AND gate 314 of the differential-pulse generating circuit 31, and thus the mask signal NCHON is inputted to the gates of the switching devices 321a and 321b. This causes the switching devices 321a and 321b to be turned on and off in response to the mask signal NCHON.

When the mask signal NCHON is high, both the switching devices 321a and 321b are on. Thus, the voltages at the nodes N5 and N6 are pulled down to the voltage of the reference-potential line L2. When the mask signal NCHON is low, both the switching devices 321a and 321b are off, and thus the impedances between the nodes N5 and N6 and the reference-potential line L2 are high.

<<<3-1-2. Pull-Up Circuit>>>

The pull-up circuit 37 couples the nodes N5 and N6 to the high-potential line L7, to apply the voltage of the high-potential line L7 to the nodes N5 and N6, in a short time period after the high mask signal NCHON is inputted to the pull-up circuit 37. The time periods in such a state correspond to the time period from time t42 to time t43 and the time period from time t47 to time t48.

The pull-up circuit 37 includes the OR gate 33 and an open/close circuit 34, and the open/close circuit 34 includes a set-side switching device 341a and a reset-side switching device 341b.

The input terminals of the OR gate 33 are coupled to the output terminal of the AND gate 314, the node N5, and the node N6, respectively. The OR gate 33 calculates the OR of the mask signal NCHON, the level-shifted set signal setdrn, and the level-shifted reset signal resdrn, and outputs the output signal nPCHON representing the OR.

Here, when all of the following conditions (a) to (c) are satisfied, the output signal nPCHON of the OR gate 33 goes low, and when even any one of the following conditions (a) to (c) is not satisfied, the output signal nPCHON of the OR gate 33 goes high.
(a) The mask signal NCHON is low. In other words, no rising change occurs in both the level-shifted set signal setdrn and the level-shifted reset signal resdrn, and thus, no pulse is generated by the differential-pulse generating circuit 31.
(b) The level-shifted set signal setdrn is low.
(c) The level-shifted reset signal resdrn is low.

The switching devices 341a and 341b are P-channel MOSFETs. The source of the switching device 341a is coupled to the high-potential line L7, and the drain of the switching device 341a is coupled to the node N5. The source of the switching device 341b is coupled to the high-potential line L7, and the drain of the switching device 341b is coupled to the node N6. The gates of the switching devices 341a and 341b are coupled to the output terminal of the OR gate 33, and thus the output signal nPCHON of the OR gate 33 is inputted to the gates of the switching devices 341a and 341b. This causes the switching devices 341a and 341b to be turned on and off in response to the output signal nPCHON of the OR gate 33.

When the output signal nPCHON of the OR gate 33 is low, both the switching devices 341a and 341b are on. Accordingly, the nodes N5 and N6 are coupled to the high-potential line L7, and the voltage of the high-potential line L7 is applied to the nodes N5 and N6. When the output signal nPCHON of the OR gate 33 is high, both the switching devices 341a and 341b are off, and thus, the impedances between the nodes N5 and N6 and the high-potential line L7 are high.

<<<3-1-3. Protection Circuit>>>

The voltage of the high-side DC power supply 6 using the potential of the reference-potential line L2 as a reference is supplied to the protection circuit 24A. The protection circuit 24A determines the state of the output PO to the latch circuit based on the level-shifted set signal setdrn and the level-shifted reset signal resdrn. As illustrated in FIG. 12, in the case where the level-shifted set signal setdrn is low, and the level-shifted reset signal resdrn is high, the protection circuit 24A outputs a high signal to the latch circuit 25. The time period in such a state corresponds to the time period from time t43 to time t44.

In the case where the level-shifted set signal setdrn is high, and the level-shifted reset signal resdrn is low, the protection circuit 24A outputs a low signal to the latch circuit 25. The time period in such a state corresponds to the time period from time t48 to time t49.

In the case where both the level-shifted set signal setdrn and the level-shifted reset signal resdrn are low or high, the protection circuit 24A causes the output PO to be in the high-impedance state. The time periods in such a state correspond to the time period from time t44 to time t48 and the time period from time t49 to time t43.

The protection circuit 24A includes an inverter 241A and switching devices 244A to 247A.

The switching devices 244A and 245A are P-channel MOSFETs, and the switching devices 246A and 247A are N-channel MOSFETs. The switching devices 244A to 247A are arranged from the high-potential line L7 to the reference-potential line L2 and coupled in series between the high-potential line L7 and the reference-potential line L2. As an example, the source of the switching device 244A is coupled to the high-potential line L7, the drain of the switching device 244A to the source of the switching device 245A, the drain of the switching device 245A to the drain of the switching device 246A, the source of the switching device 246A to the drain of the switching device 247A, and the source of the switching device 247A to the reference-potential line L2.

The gates of the switching device 244A and the switching device 246A are coupled to the node N5, and thus the level-shifted set signal setdrn is inputted to the gates of the switching device 244A and the switching device 246A. This causes the switching device 244A to be on, and causes the switching device 246A to be off, when the level-shifted set signal setdrn is low. This also causes the switching device 244A to be off, and causes the switching device 246A to be on, when the level-shifted set signal setdrn is high.

The gates of the switching device 245A and the switching device 247A are coupled to the node N6 via the inverter 241A, and an inverted signal of the level-shifted reset signal resdrn is inputted to the gates of the switching device 245A and the switching device 247A. This causes the switching device 245A to be off and the switching device 247A to be on, when the level-shifted reset signal resdrn is low. This also causes the switching device 245A to be on and the switching device 247A to be off, when the level-shifted reset signal resdrn is high.

The electrical state of the node N8, in other words, the state of the output PO of the protection circuit 24A is determined by the combinations of ons and offs of the switching devices 244A to 247A. When both the switching devices 244A and 245A are on and both the switching devices 246A and 247A are off, the voltage at the node N8 is pulled up by the high-side DC power supply 6, and the output PO is high. When both the switching devices 246A and 247A are on and both the switching devices 244A and 245A are off, the voltage at the node N8 is pulled down by the voltage of the reference-potential line L2, and the output PO is low. When at least one of the switching devices 244A and 245A is off, and at least one of the switching devices 246A and 247A is off, the node N8 is in a floating state, and the output PO is in a high-impedance state. Details will be given as in Table 2. Table 2 gives a relationship among the level-shifted set signal setdrn, the level-shifted reset signal resdrn, the switching devices 244A to 247A, and the state of the output PO of the protection circuit 24A.

Thereafter, the output signal nDON of the inverter 313 falls with a delay from the output signal DON of the NAND gate 311. At time t42, the output signal nDON of the inverter 313 becomes equal to or smaller than the threshold of the AND gate 314, and the mask signal NCHON, which is the output signal of the AND gate 314, goes low. This turns off the switching devices 321a and 321b of the pull-down circuit 32, and the continuities between the nodes N5 and N6 and the reference-potential line L2 are open. However, the level-shifted set signal setdrn and the level-shifted reset signal resdrn still remain low, and thus, the output PO of the protection circuit 24A remains in the high-impedance state, and the output signal RO of the latch circuit 25 and the drive signal HO remain low, at time t42 and thereafter as well.

At time t42, all of the mask signal NCHON, the level-shifted set signal setdrn, and the level-shifted reset signal resdrn are low, and thus the output signal nPCHON of the OR gate 33 goes low. This turns on the switching devices 341a and 341b of the pull-up circuit 37. Accordingly, the voltage at the node N6 is pulled up by the voltage of the high-potential line L7, and the level-shifted reset signal resdrn goes high at time t43. Meanwhile, the voltage at the

TABLE 2

| setdrn | resdrn | SWITCHING DEVICE 244 | SWITCHING DEVICE 245 | SWITCHING DEVICE 246 | SWITCHING DEVICE 247 | PO |
|---|---|---|---|---|---|---|
| H | H | OFF | ON | ON | OFF | Hi-Z |
| L | H | ON | ON | OFF | OFF | H |
| H | L | OFF | OFF | ON | ON | L |
| L | L | ON | OFF | OFF | ON | Hi-Z |

4. Operation of Drive Circuit

Before time t40, both the level-shifted set signal setdrn and the level-shifted reset signal resdrn are high, the output PO of the protection circuit 24A is in the high-impedance state, and the output signal RO of the latch circuit 25 and the drive signal HO are low. In addition, the output signal DON of the NAND gate 311 is low, the output signal nDON of the inverter 313 is high, and the output signal nPCHON of the OR gate 33 is high.

At time t40, the level shift switching device 211a is turned on in response to the set signal set, and the level-shifted set signal setdrn starts falling. Accordingly, the output signal DON of the NAND gate 311 starts rising. Then, at time t41, the output signal DON of the NAND gate 311 exceeds the threshold of the AND gate 314, and the mask signal NCHON, which is the output signal of the AND gate 314, goes high. Here, the charging and discharging times of the switching devices 244A and 246A of the protection circuit 24A are longer than the time period from time t40 to time t41. Thus on and off of the switching devices 244A and 246A do not change even when the level-shifted set signal setdrn starts falling at time t40.

The switching devices 321a and 321b of the pull-down circuit 32 are turned on in response to the high mask signal NCHON. This causes the voltages at the nodes N5 and N6 to be pulled down by the voltage of the reference-potential line L2, and both the level-shifted set signal setdrn and the level-shifted reset signal resdrn go low. Accordingly, the switching devices 245A and 246A are turned off. Thus, the output PO of the protection circuit 24A remains in the high-impedance state, and the output signal RO of the latch circuit 25 and the drive signal HO remain low, at time t41 and thereafter as well.

node N5 is not pulled up, and the level-shifted set signal setdrn is kept low. This is because the level shift switching device 211a is on.

Accordingly, at time t43, the output PO of the protection circuit 24A goes high, and the output signal RO of the latch circuit 25 and the drive signal HO go high.

In addition, the level-shifted reset signal resdrn goes high at time t43, and thus the output signal nPCHON of the OR gate 33 goes high. This turns off the switching devices 341a and 341b of the pull-up circuit 37, and the continuities between the nodes N5 and N6 and the high-potential line L7 are open.

Thereafter, the set signal set falls, and the level-shifted set signal setdrn rises. Then, at time t44, the level-shifted set signal setdrn goes high, and the level shift switching device 211a is turned off. During the time period from time t44 to time t45, both the level-shifted set signal setdrn and the level-shifted reset signal resdrn are high. Thus, the output PO of the protection circuit 24A is in the high-impedance state, the output signal RO of the latch circuit 25 is held high, and the drive signal HO remains high.

At time t45, the level shift switching device 211b is turned on in response to the reset signal res, and the level-shifted reset signal resdrn starts falling. Accordingly, the output signal DON of the NAND gate 311 starts rising. Then, at time t46, the output signal DON of the NAND gate 311 exceeds the threshold of the AND gate 314, and the mask signal NCHON, which is the output signal of the AND gate 314, goes high. Here, the charging and discharging times of the switching devices 245A and 247A of the protection circuit 24A are longer than the time period from time t45 to time t46. Thus, on and off of the switching devices 245A and 247A do not change even when the level-shifted reset signal resdrn starts falling at time t45.

The switching devices 321a and 321b of the pull-down circuit 32 are turned on in response to the high mask signal NCHON. This causes the voltages at the nodes N5 and N6 to be pulled down by the voltage of the reference-potential line L2, and both the level-shifted set signal setdrn and the level-shifted reset signal resdrn go low. Accordingly, the switching devices 245A and 246A are turned off. Thus, the output PO of the protection circuit 24A remains in the high-impedance state, and the output signal RO of the latch circuit 25 and the drive signal HO remain high, at time t45 and thereafter as well.

Thereafter, the output signal nDON of the inverter 313 falls with a delay from the output signal DON of the NAND gate 311. At time t47, the output signal nDON of the inverter 313 becomes equal to or smaller than the threshold of the AND gate 314, and the mask signal NCHON, which is the output signal of the AND gate 314, goes low. This turns off the switching devices 321a and 321b of the pull-down circuit 32 and the continuities between the nodes N5 and N6 and the reference-potential line L2 are open. However, the level-shifted set signal setdrn and the level-shifted reset signal resdrn still remain low. Thus, the output PO of the protection circuit 24A remains in the high-impedance state, and the output signal RO of the latch circuit 25 and the drive signal HO remain high, at time t47 and thereafter as well.

At time t47, all of the mask signal NCHON, the level-shifted set signal setdrn, and the level-shifted reset signal resdrn are low, and thus the output signal nPCHON of the OR gate 33 goes low. This turns on the switching devices 341a and 341b of the pull-up circuit 37. Accordingly, the voltage at the node N5 is pulled up by the voltage of the high-potential line L7, and the level-shifted set signal setdrn goes high at time t48. Meanwhile, the voltage at the node N6 is not pulled up, and the level-shifted reset signal resdrn is kept low. This is because the level shift switching device 211b is on.

Accordingly, at time t48, the output PO of the protection circuit 24A goes high, and the output signal RO of the latch circuit 25 and the drive signal HO go high.

In addition, the level-shifted set signal setdrn goes high at time t48, and thus the output signal nPCHON of the OR gate 33 goes high. This turns off the switching devices 341a and 341b of the pull-up circuit 37, and the continuities between the nodes N5 and N6 and the high-potential line L7 are open.

Thereafter, the reset signal res falls, and the level-shifted reset signal resdrn rises. Then, at time t49, the level-shifted reset signal resdrn goes high, and the level shift switching device 211b is turned off. During the time period from time t49 to time t40, both the level-shifted set signal setdrn and the level-shifted reset signal resdrn are high. Thus, the output PO of the protection circuit 24A has a high impedance, the output signal RO of the latch circuit 25 is held low, and the drive signal HO remains low.

5. When External Noise Occurs

Due to external noise caused by a three-phase current and/or the like, one of the voltages at the node N5 and the node N6 may fall with a delay from the other. This may cause the voltages at the node N5 and the node N6 to erroneously drop. Even in such a case, the latch circuit 25 does not malfunction, and the drive signal HO is held in the state before the occurrence of the external noise. Details will be described below.

Figure 13:
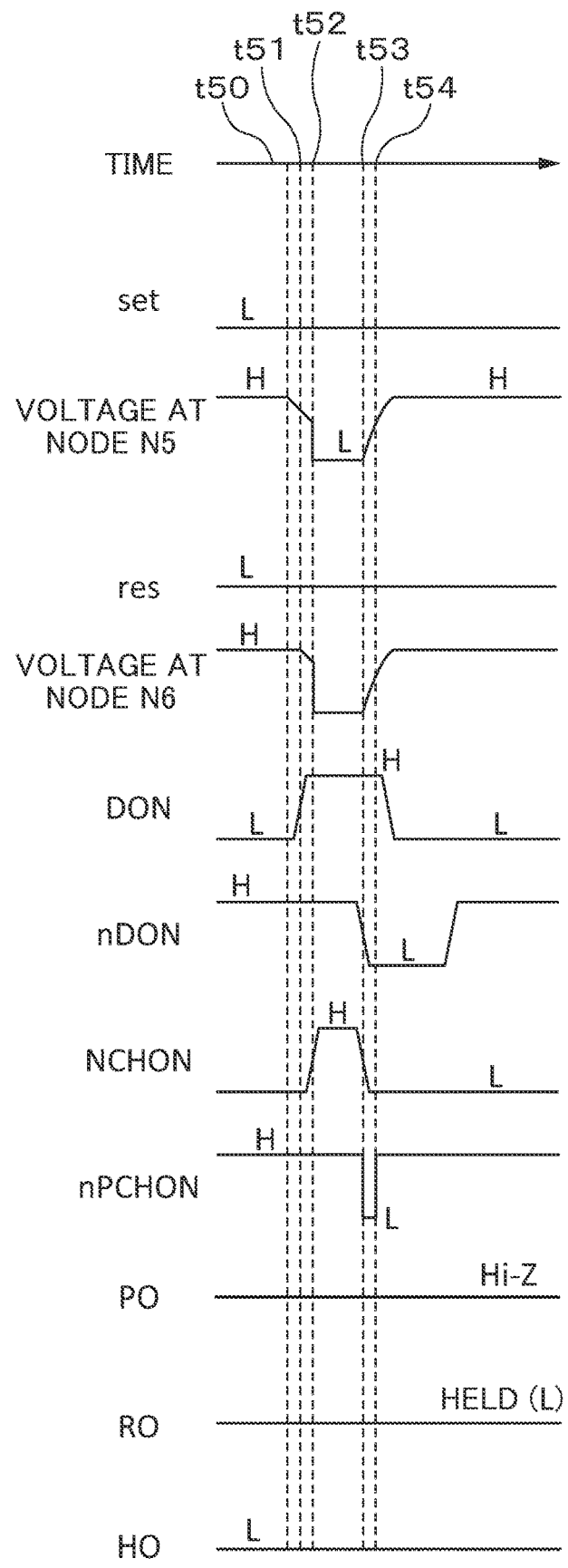
FIG. 13 is a timing chart illustrating waveforms of signals when external noise occurs in a second embodiment.

FIG. 13 illustrates a timing chart in the case where external noise occurs during the time period from time t49 to time t40. Before external noise occurs, the level-shifted set signal setdrn (the voltage at the node N5) and the level-shifted reset signal resdrn (the voltage at the node N6) are high. Further, the mask signal NCHON, which is the output signal of the differential-pulse generating circuit 31, is low, and thus the switching devices 321a and 321b are off, and the continuities between the nodes N5 and N6 and the reference-potential line L2 are open. In addition, the output signal nPCHON of the OR gate 33 is high, and thus the switching devices 341a and 341b are off, and the continuities between the nodes N5 and N6 and the high-potential line L7 are open.

Then, the voltage at the node N5 starts falling at time t50 due to external noise, and the voltage at the node N6 starts falling at time t51 with a delay therefrom. Accordingly, the output signal DON of the NAND gate 311 starts rising. At time t52, the output signal DON of the NAND gate 311 exceeds the threshold of the AND gate 314, and the mask signal NCHON, which is the output signal of the AND gate 314, goes high. Thus, the switching devices 321a and 321b of the pull-down circuit 32 are turned on. This causes the voltages at the nodes N5 and N6 to be pulled down by the voltage of the reference-potential line L2, and both the voltages at the node N5 and the node N6 go low. Accordingly, the switching devices 245A and 246A are turned off. Thus, the output PO of the protection circuit 24A remains in the high-impedance state, and the output signal RO of the latch circuit 25 and the drive signal HO remain low, at time t52 and thereafter as well.

Thereafter, the output signal nDON of the inverter 313 falls with a delay from the output signal DON of the NAND gate 311. At time t53, the output signal nDON of the inverter 313 becomes equal to or smaller than the threshold of the AND gate 314, and the mask signal NCHON, which is the output signal of the AND gate 314, goes low. This turns off the switching devices 321a and 321b of the pull-down circuit 32, and the continuities between the nodes N5 and N6 and the reference-potential line L2 are open. However, the voltages at the node N5 and the node N6 still remain low. Thus, the output PO of the protection circuit 24A remains in the high-impedance state, and the output signal RO of the latch circuit 25 and the drive signal HO remain low, at time t53 and thereafter as well.

At time t53, all of the mask signal NCHON, the voltage at the node N5, and the voltage at the node N6 are low, and thus the output signal nPCHON of the OR gate 33 goes low. Thus, the switching devices 341a and 341b of the pull-up circuit 37 are turned on. This causes the voltages at the nodes N5 and N6 to be pulled up by the voltage of the high-potential line L7, and the voltages at the node N5 and the node N6 go high at time t54. Thus, the output PO of the protection circuit 24A remains in the high-impedance state, and the output signal RO of the latch circuit 25 and the drive signal HO remain low, at time t54 and thereafter as well.

Figure 14:
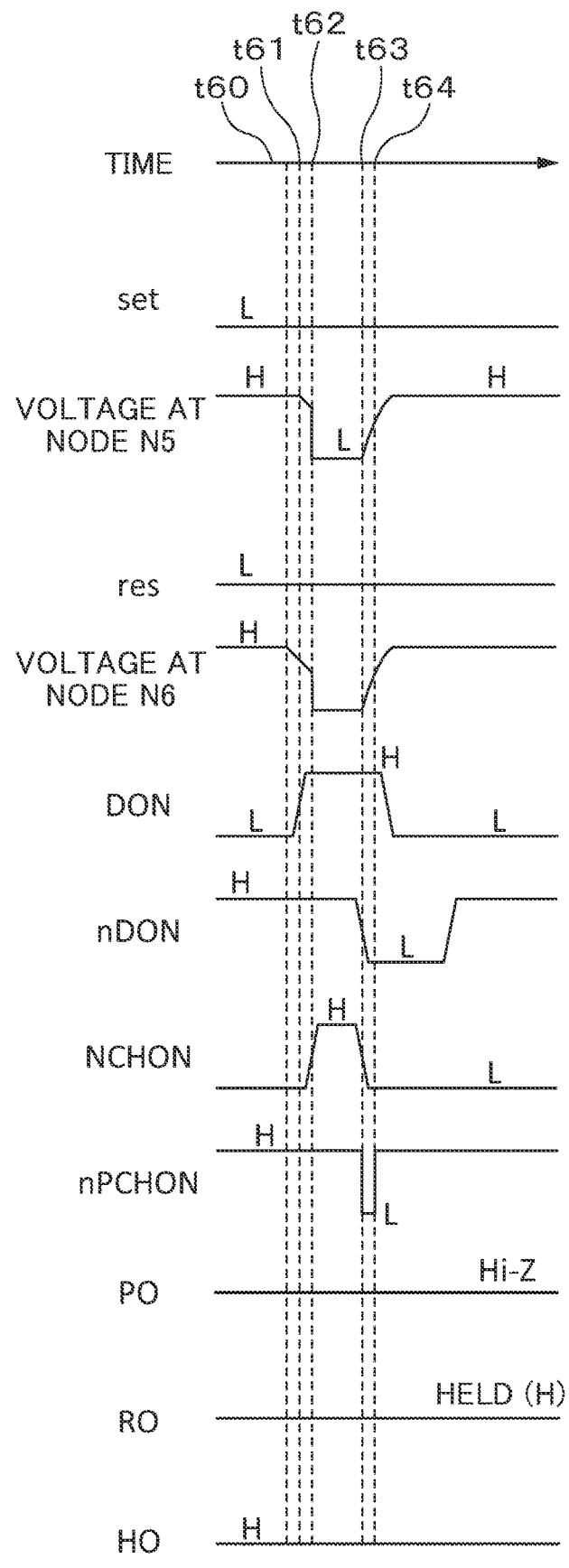
FIG. 14 is a timing chart illustrating waveforms of signals when external noise occurs in a second embodiment.

FIG. 14 illustrates a timing chart in the case where external noise occurs during the time period from time t44 to time t45. Before external noise occurs, the voltages at the node N5 and the node N6 are high. Further, the mask signal NCHON, which is the output signal of the differential-pulse generating circuit 31, is low, and thus the switching devices 321a and 321b are off, and the continuities between the nodes N5 and N6 and the reference-potential line L2 are open. In addition, the output signal nPCHON of the OR gate 33 is high, and thus the switching devices 341a and 341b are off, and the continuities between the nodes N5 and N6 and the high-potential line L7 are open.

Then, due to external noise, the voltage at the node N6 starts falling at time t60, and the voltage at the node N5 also starts falling at time t61 with a delay therefrom. Accordingly, the output signal DON of the NAND gate 311 starts rising. Then, at time t62, the output signal DON of the NAND gate 311 exceeds the threshold of the AND gate 314, and the mask signal NCHON, which is the output signal of the AND gate 314, goes high. Thus, the switching devices 321a and 321b of the pull-down circuit 32 are turned on. This causes the voltages at the nodes N5 and N6 to be pulled down by the voltage of the reference-potential line L2, and both the voltages at the node N5 and the node N6 go low. Accordingly, the switching devices 245A and 246A are turned off. Thus, the output PO of the protection circuit 24A remains in the high-impedance state, and the output signal RO of the latch circuit 25 and the drive signal HO remain high, at time t62 and thereafter as well.

Thereafter, the output signal nDON of the inverter 313 falls with a delay from the output signal DON of the NAND gate 311. At time t63, the output signal nDON of the inverter 313 becomes equal to or smaller than the threshold of the AND gate 314, and the mask signal NCHON goes low. This turns off the switching devices 321a and 321b of the pull-down circuit 32 and the continuities between the nodes N5 and N6 and the reference-potential line L2 are open. However, the voltages at the node N5 and the node N6 still remain low. Thus, the output PO of the protection circuit 24A remains in the high-impedance state, and the output signal RO of the latch circuit 25 and the drive signal HO remain high, at time t63 and thereafter as well.

At time t63, all of the mask signal NCHON, the voltage at the node N5, and the voltage at the node N6 are low, and thus the output signal nPCHON of the OR gate 33 goes low. Thus, the switching devices 341a and 341b of the pull-up circuit 37 are turned on. This causes the voltages at the nodes N5 and N6 to be pulled up by the voltage of the high-potential line L7, and the voltages at the node N5 and the node N6 go high at time t64. Thus, the output PO of the protection circuit 24A remains in the high-impedance state, and the output signal RO of the latch circuit 25 and the drive signal HO remain high, at time t64 and thereafter as well.

6. Recapitulation

Even in the case where one of the voltages at the node N5 and the node N6 falls with a delay from the other and the voltages at the node N5 and the node N6 erroneously go low, due to external noise, the latch circuit 25 does not malfunction, and the drive signal HO is kept in the state before the occurrence of the external noise.

Both in normal operation and at the occurrence of external noise, after both the voltages at the node N5 and the node N6 are changed to low by the pull-down circuit 32, one or both of the voltages at the node N5 and the node N6 are rapidly raised by the pull-up circuit 37. This can make it possible to operate the drive circuit 1A at high speed.

7. Modification Examples

Note that embodiments of the present disclosure described above are simply to facilitate understanding of the present disclosure and are not in any way to be construed as limiting the present disclosure. The present disclosure may variously be changed or altered without departing from its essential features and encompass equivalents thereof. For example, modifications described in the following (1) and (2) are possible. The following modifications in (1) and (2) may be combined.

(1) First Modification Example

The protection circuit 24A in the second embodiment may be replaced with the protection circuit 24 in the first embodiment. In this case, the differential-pulse generating circuit 23a and the differential-pulse generating circuit 23b in the first embodiment are also provided in the drive circuit 1A in the second embodiment.

(2) Second Modification Example

The latch circuit 25 may be a flip-flop circuit. In this case, the node N5 is coupled to the S terminal of the flip-flop via an inverter and the protection circuit 24A, the node N6 is coupled to the R terminal of the flip-flop via an inverter and the protection circuit 24A, and the Q terminal of the flip-flop is coupled to the high-side driver 26. In this case, the configuration of the protection circuit 24A is different from the one illustrated in FIGS. 10 and 11, and the protection circuit 24A has functions as described below.

The protection circuit 24A does not allow the level-shifted set signal setdrn and the level-shifted reset signal resdrn to pass therethrough, when both the inverted signals of the level-shifted set signal setdrn and the level-shifted reset signal resdrn are high or low. Thus, the inverted signal of the level-shifted set signal setdrn is not outputted from the protection circuit 24A to the S terminal of the flip-flop, and the inverted signal of the level-shifted reset signal resdrn is not outputted from the protection circuit 24 to the R terminal of the flip-flop.

Further, after receiving the high mask signal SMASK or the high mask signal RMASK, the protection circuit 24 allows the inverted signals of the level-shifted set signal setdrn and the level-shifted reset signal resdrn to pass therethrough, when one of the level-shifted set signal setdrn and the level-shifted reset signal resdrn is high and the other thereof is low. Thus, the inverted signal of the level-shifted set signal setdrn is outputted from the protection circuit 24 to the S terminal of the flip-flop, and the inverted signal of the level-shifted reset signal resdrn is outputted from the protection circuit 24 to the R terminal of the flip-flop.

The provision of the protection circuit 24A and flip-flop as described above also can prevent the flip-flop from malfunctioning due to external noise. In other words, even in the case where: the potentials of the nodes N5 and N6 fluctuate due to external noise; one of the level-shifted set signal setdrn and the level-shifted reset signal resdrn falls with a delay from the other; and the level-shifted set signal setdrn and the level-shifted reset signal resdrn erroneously go low, the flip-flop does not malfunction, and the drive signal HO is kept in the state before occurrence of external noise.

According to embodiments of the present invention, it is possible to prevent a drive circuit from malfunctioning at occurrence of noise.

What is claimed is:

1. A drive circuit comprising:
 a set-side level shift circuit configured to shift a level of a set signal, and output the level-shifted set signal from a set-side output node;
 a reset-side level shift circuit configured to shift a level of a reset signal, and output the level-shifted reset signal from a reset-side output node;
 a mask-signal generating circuit configured to output a first mask signal and a second mask signal respectively in response to a change in a voltage at the set-side output node and a change in a voltage at the reset-side output node; and a control circuit configured to receive the level-shifted set signal, the level-shifted reset signal, the first mask signal and the second mask signal, and to accordingly output a drive signal to a power device, wherein the set signal includes a first high level pulse, whereby the level of the set signal increases from a low level to a high level and subsequently returns to the low level after a first time period, to thereby cause
- the set-side level shift circuit to decrease a level of the level-shifted set signal, from the high level, to the low level for the first time period,
- the mask-signal generating circuit to increase a level of the first mask signal, from the low level, to the high level for another first time period shorter than the first time period, and
- the control circuit to increase a level of the drive signal to the high level for turning on the power device, in response to the level-shifted set signal being at the low level when the level of the first mask signal returns to the low level after said another first time period; and the reset signal includes a second high level pulse, whereby the level of the reset signal increases from the low level to the high level and subsequently returns to the low level after a second time period, to thereby cause
- the reset-side level shift circuit to decrease a level of the level-shifted reset signal, from the high level, to the low level for the second time period,
- the mask-signal generating circuit to increase a level of the second mask signal, from the low level, to the high level for another second time period shorter than the second time period, and
- the control circuit to decrease the level of the drive signal to the low level for turning off the power device, in response to the level-shifted reset signal being at the low level when the level of the second mask signal returns to the low level after said another second time period.

2. The drive circuit according to claim 1, wherein the control circuit includes
- a latch control circuit configured to
  - cause an output of the latch control circuit to be in a high-impedance state or output a signal that is in a same state as before receiving the first or second mask signal, while receiving the first or second mask signal, and
  - output a signal based on the voltage at the reset-side output node and the voltage at the set-side output node, after receiving the first or second mask signal,
- a latch circuit configured to latch the signal outputted by the latch control circuit, and
- a drive-signal output circuit configured to output the drive signal in response to an output of the latch circuit.

3. The drive circuit according to claim 2, wherein the time period of the first or second mask signal is longer than
- a third time period from when the first or second mask signal is inputted to the latch control circuit to when the latch control circuit causes the output of the latch control circuit to be in the high-impedance state, or
- a fourth time period from when the first or second mask signal is inputted to the latch control circuit to when the latch control circuit outputs the signal in the same state as before receiving the mask signal.

4. The drive circuit according to claim 2, wherein the latch control circuit is configured to, when the voltage at the set-side output node and the voltage at the reset-side output node have a same logic level, cause the output of the latch control circuit to be in the high-impedance state, or output the signal in the same state as before receiving the first or second mask signal.

5. The drive circuit according to claim 3, wherein the mask-signal generating circuit includes
- a set-side differential-pulse generating circuit configured to generate the first mask signal, according to the change in the voltage at the set-side output node, to a logic level for turning on the power device, and
- a reset-side differential-pulse generating circuit configured to generate the second mask signal, according to the change in the voltage at the reset-side output node, to a logic level for turning off the power device.

6. The drive circuit according to claim 5, wherein the set-side differential-pulse generating circuit includes
- a set-side delay circuit configured to delay a signal from the set-side output node,
- a set-side inverter configured to invert an output signal of the set-side delay circuit, and
- a set-side NOR gate configured to calculate a negative OR of
  - an output signal of the set-side inverter, and
  - the signal from the set-side output node, and output a calculation result to the latch control circuit as the first mask signal.

7. The drive circuit according to claim 5, wherein the reset-side differential-pulse generating circuit includes
- a reset-side delay circuit configured to delay a signal from the reset-side output node,
- a reset-side inverter configured to invert an output signal of the reset-side delay circuit, and
- a reset-side NOR gate configured to calculate a negative OR of
  - an output signal of the reset-side inverter, and
  - the signal from the reset-side output node, and output a calculation result to the latch control circuit as the second mask signal.

8. The drive circuit according to claim 1, further comprising:
- an input circuit configured to
  - receive an input signal for giving an instruction to turn on and off the power device, and
  - delay the input signal by a time according to the another first time period or the another second time period; and
- a pulse generating circuit configured to generate the set signal and the reset signal based on an output from the input circuit.

9. The drive circuit according to claim 1, wherein each of the set signal, the level-shifted set signal, the reset signal, the level-shifted reset signal and the first and second mask signals has a pulsed shape.

10. The drive circuit according to claim 1, wherein
the mask-signal generating circuit is further configured to output a third mask signal and a fourth mask signal respectively in response to the change in the voltage at the set-side output node and the change in the voltage at the reset-side output node;
the control circuit is configured to receive the level-shifted set signal, the level-shifted reset signal, the first mask signal, the second mask signal, the third mask signal, and the fourth mask signal and to accordingly output the drive signal to the power device;

the first high level pulse in the set signal causes
the mask-signal generating circuit to increase a level of the third mask signal, from the low level, to the high level for yet another first time period shorter than the first time period, and
the control circuit to increase the level of the drive signal to the high level for turning on the power device, in response to the level-shifted set signal being at the low level when the level of the first mask signal returns to the low level before said yet another first time period and after said another first time period; and
the second high level pulse in the reset signal causes
the mask-signal generating circuit to increase a level of the fourth mask signal, from the low level, to the high level for yet another second time period shorter than the second time period, and
the control circuit to decrease the level of the drive signal to the low level for turning off the power device, in response to the level-shifted reset signal being at the low level when the level of the second mask signal returns to the low level before said yet another second time period and after said another first time period.

11. A drive circuit, comprising:
a set-side level shift circuit configured to shift a level of a set signal, and output the level-shifted set signal from a set-side output node;
a reset-side level shift circuit configured to shift a level of a reset signal, and output the level-shifted reset signal from a reset-side output node;
a mask-signal generating circuit configured to output a mask signal in response to a change in a voltage at the set-side output node or a change in a voltage at the reset-side output node, the mask signal being for a time period shorter than a first time period during which the level-shifted set signal is outputted or shorter than a second time period during which the level-shifted reset signal is outputted; and
a control circuit configured to output a drive signal to a power device, the drive signal
remaining at a same level while the control circuit is receiving the mask signal,
switching to a first level for turning off the power device, in response to the control circuit receiving the level-shifted reset signal after receiving the mask signal, and
switching to a second level for turning on the power device, in response to the control circuit receiving the level-shifted set signal after receiving the mask signal, wherein the control circuit includes
a latch control circuit configured to
cause an output of the latch control circuit to be in a high-impedance state or output a signal that is in a same state as before receiving the mask signal, while receiving the mask signal, and
output a signal based on the voltage at the reset-side output node and the voltage at the set-side output node, after receiving the mask signal,
a latch circuit configured to latch the signal outputted by the latch control circuit, and
a drive-signal output circuit configured to output the drive signal in response to an output of the latch circuit;
wherein the time period of the mask signal is longer than
a third time period from when the mask signal is inputted to the latch control circuit to when the latch control circuit causes the output of the latch control circuit to be in the high-impedance state, or
a fourth time period from when the mask signal is inputted to the latch control circuit to when the latch control circuit outputs the signal in the same state as before receiving the mask signal;
wherein the mask signal is one of a first mask signal and a second mask signal;
wherein the mask-signal generating circuit includes
a set-side differential-pulse generating circuit configured to generate the first mask signal, according to the change in the voltage at the set-side output node, to a logic level for turning on the power device, and
a reset-side differential-pulse generating circuit configured to generate the second mask signal, according to the change in the voltage at the reset-side output node, to a logic level for turning off the power device; and
wherein the latch control circuit includes
first, second, and third P-channel switching devices coupled in series between an output node of the latch control circuit and a high-potential line having a potential higher than a potential of a reference-potential line,
first, second, third N-channel switching devices coupled in series between the output node of the latch control circuit and the reference-potential line,
a first inverter configured to invert a signal from the reset-side output node, and output a resultant signal to a gate of the third P-channel switching device and a gate of the second N-channel switching device, and
a second inverter configured to invert the second mask signal outputted by the reset-side differential-pulse generating circuit, and output a resultant signal to a gate of the third N-channel switching device, wherein
a signal from the set-side output node is inputted to a gate of the second P-channel switching device and a gate of the first N-channel switching device, and
the first mask signal outputted by the set-side differential-pulse generating circuit is inputted to a gate of the first P-channel switching device.

12. A drive circuit, comprising:
a set-side level shift circuit configured to shift a level of a set signal, and output the level-shifted set signal from a set-side output node;
a reset-side level shift circuit configured to shift a level of a reset signal, and output the level-shifted reset signal from a reset-side output node;
a mask-signal generating circuit configured to output a mask signal in response to a change in a voltage at the set-side output node or a change in a voltage at the reset-side output node, the mask signal being for a time period shorter than a first time period during which the level-shifted set signal is outputted or shorter than a second time period during which the level-shifted reset signal is outputted; and
a control circuit configured to output a drive signal to a power device, the drive signal
remaining at a same level while the control circuit is receiving the mask signal,
switching to a first level for turning off the power device, in response to the control circuit receiving the level-shifted reset signal after receiving the mask signal, and switching to a second level for turning on the power device, in response to the control circuit receiving the level-shifted set signal after receiving the mask signal, wherein the control circuit includes
a latch control circuit configured to
cause an output of the latch control circuit to be in a high-impedance state or output a signal that is in a same state as before receiving the mask signal, while receiving the mask signal, and
output a signal based on the voltage at the reset-side output node and the voltage at the set-side output node, after receiving the mask signal,
a latch circuit configured to latch the signal outputted by the latch control circuit, and
a drive-signal output circuit configured to output the drive signal in response to an output of the latch circuit;

wherein the time period of the mask signal is longer than
a third time period from when the mask signal is inputted to the latch control circuit to when the latch control circuit causes the output of the latch control circuit to be in the high-impedance state, or
a fourth time period from when the mask signal is inputted to the latch control circuit to when the latch control circuit outputs the signal in the same state as before receiving the mask signal;

wherein the mask-signal generating circuit outputs the mask signal,
responsive to the change in the voltage at the set-side output node, at a logic level for turning on the power device, or
responsive to the change in the voltage at the reset-side output node, at a logic level for turning off the power device; and wherein the latch control circuit includes
a pull-down circuit configured to pull down, while receiving the mask signal, both the voltage at the set-side output node and the voltage at the reset-side output node, such that the voltage at the set-side output node and the voltage at the reset-side output node are at a same logic level, and
a protection circuit configured to output, to the latch circuit, a signal based on the voltage at the set-side output node and the voltage at the reset-side output node.

13. The drive circuit according to claim 12, wherein the pull-down circuit causes the voltage at the set-side output node and the voltage at the reset-side output node to be at the same logic level, before the protection circuit outputs the signal based on the voltage at the set-side output node and the voltage at the reset-side output node.

14. The drive circuit according to claim 12, wherein the mask-signal generating circuit includes
a NAND gate configured to calculate a negative AND of the voltage at the set-side output node and the voltage at the reset-side output node,
a delay circuit configured to delay a calculation result outputted by the NAND gate,
a second inverter configured to invert an output signal of the delay circuit, and
an AND gate configured to calculate an AND of the calculation result outputted by the NAND gate, and an output signal of the second inverter, and output a calculation result as the mask signal.

15. The drive circuit according to claim 12, wherein the pull-down circuit includes
a set-side switching device coupled between a reference-potential line and the set-side output node, and
a reset-side switching device coupled between the reset-side output node and the reference-potential line, and
the mask signal is inputted to the set-side switching device and the reset-side switching device.

16. The drive circuit according to claim 12, wherein the latch control circuit includes
a pull-up circuit configured to apply a voltage of a high-potential line to the set-side output node and the reset-side output node for a predetermined time period, after receiving the mask signal.

17. The drive circuit according to claim 16, wherein the pull-up circuit includes
an OR gate configured to calculate an OR of
the mask signal,
a signal from the set-side output node, and
a signal from the reset-side output node,
a second set-side switching device coupled between the high-potential line and the set-side output node, and
a second reset-side switching device coupled between the reset-side output node and the high-potential line, and
an output signal of the OR gate is inputted to the second set-side switching device and the second reset-side switching device.

18. The drive circuit according to claim 17, wherein the set-side level shift circuit includes
a set-side level shift switching device configured to be turned on and off in response to the set signal, and
a set-side resistor coupled in series to the set-side level shift switching device via the set-side output node, between the high-potential line and a second reference-potential line having a potential lower than a potential of the high-potential line, and the reset-side level shift circuit includes
a reset-side level shift switching device configured to be turned on and off in response to the reset signal, and
a reset-side resistor coupled in series to the reset-side level shift switching device via the reset-side output node, between the high-potential line and the second reference-potential line.

19. The drive circuit according to claim 12, wherein the protection circuit includes
first and second P-channel switching devices coupled in series between a high-potential line and an output node of the protection circuit,
first and second N-channel switching devices coupled in series between the output node of the protection circuit and a reference-potential line having a potential lower than a potential of the high-potential line, and
a first inverter configured to invert a signal from the reset-side output node, and output a resultant signal to a gate of the second P-channel switching device and a gate of the second N-channel switching device, and
a signal from the set-side output node is inputted to a gate of the first P-channel switching device and a gate of the first N-channel switching device.

* * * * *